US012489052B2

(12) United States Patent
Ozawa et al.

(10) Patent No.: US 12,489,052 B2
(45) Date of Patent: Dec. 2, 2025

(54) SEMICONDUCTOR MEMORY DEVICE WITH WIRING LAYER HAVING DEFINED FIRST, SECOND AND PASSING WIRING GROUPS

(71) Applicant: Kioxia Corporation, Tokyo (JP)

(72) Inventors: Toru Ozawa, Kamakura (JP); Yoichi Mizuta, Yokohama (JP)

(73) Assignee: Kioxia Corporation, Tokyo (JP)

( * ) Notice: Subject to any disclaimer, the term of this patent is extended or adjusted under 35 U.S.C. 154(b) by 715 days.

(21) Appl. No.: 17/807,195

(22) Filed: Jun. 16, 2022

(65) Prior Publication Data

US 2023/0307357 A1  Sep. 28, 2023

(30) Foreign Application Priority Data

Mar. 22, 2022 (JP) .................................. 2022-045750

(51) Int. Cl.
*H01L 23/528* (2006.01)
*H01L 23/00* (2006.01)
(Continued)

(52) U.S. Cl.
CPC ........ *H01L 23/528* (2013.01); *H01L 23/5226* (2013.01); *H01L 24/08* (2013.01); *H01L 25/0657* (2013.01); *H01L 25/18* (2013.01); H01L 2224/08145 (2013.01); H01L 2924/1431 (2013.01); H01L 2924/14511 (2013.01)

(58) Field of Classification Search
CPC ... H01L 23/528; H01L 23/5226; H01L 24/08; H01L 25/0657; H01L 25/18; H01L 2224/08145; H01L 2924/1431; H01L 2924/14511; H10B 43/27; H10B 43/40; H10B 43/10
See application file for complete search history.

(56) References Cited

U.S. PATENT DOCUMENTS 9,372,955 B1  6/2016 Lee et al.
9,793,211 B2  10/2017 Peng et al.
(Continued)

FOREIGN PATENT DOCUMENTS

JP  2020-57679 A  4/2020
JP  2021-64731 A  4/2021

*Primary Examiner* — Davienne N Monbleau
*Assistant Examiner* — John Patrick Cornely
(74) *Attorney, Agent, or Firm* — Oblon, McClelland, Maier & Neustadt, L.L.P.

(57) ABSTRACT

A semiconductor substrate includes a first circuit region, a second circuit region, and a third circuit region. A wiring layer includes a first boundary region that includes a first boundary between the first and second circuit regions, a second boundary region that includes a second boundary between the second and the third circuit regions, and a passing wiring region between the first and second boundary regions. The first boundary region includes a first wiring group, the second boundary region includes a second wiring group, and the passing wiring region includes a passing wiring group. The first wiring group, the second wiring group, and the passing wiring group are disposed in a same layer. A wiring disposed in a same layer as the passing wiring group and electrically connected to the second circuit region is included in any one of the first and second wiring groups.

14 Claims, 15 Drawing Sheets

(51) Int. Cl.
*H01L 23/522* (2006.01)
*H01L 25/065* (2023.01)
*H01L 25/18* (2023.01)

(56) References Cited

U.S. PATENT DOCUMENTS 10,833,011 B2  11/2020  Hotta
2021/0066280 A1*  3/2021  Park ........................ H01L 24/08
2021/0118862 A1  4/2021  Maejima et al.

* cited by examiner

SEMICONDUCTOR MEMORY DEVICE WITH WIRING LAYER HAVING DEFINED FIRST, SECOND AND PASSING WIRING GROUPS

CROSS-REFERENCE TO RELATED APPLICATIONS

This application is based upon and claims the benefit of Japanese Patent Application No. 2022-45750, filed on Mar. 22, 2022, the entire contents of which are incorporated herein by reference.

BACKGROUND

Field

Embodiments described herein relate generally to a semiconductor memory device.

Description of the Related Art

There has been known a semiconductor memory device that includes a substrate, a wiring layer stacked in a direction intersecting with a surface of the substrate, and a memory layer connected via the wiring layer.

BRIEF DESCRIPTION OF THE DRAWINGS

FIG. 12 is taken along line B-B' and viewed in an arrow direction;

DETAILED DESCRIPTION

Figure 1:
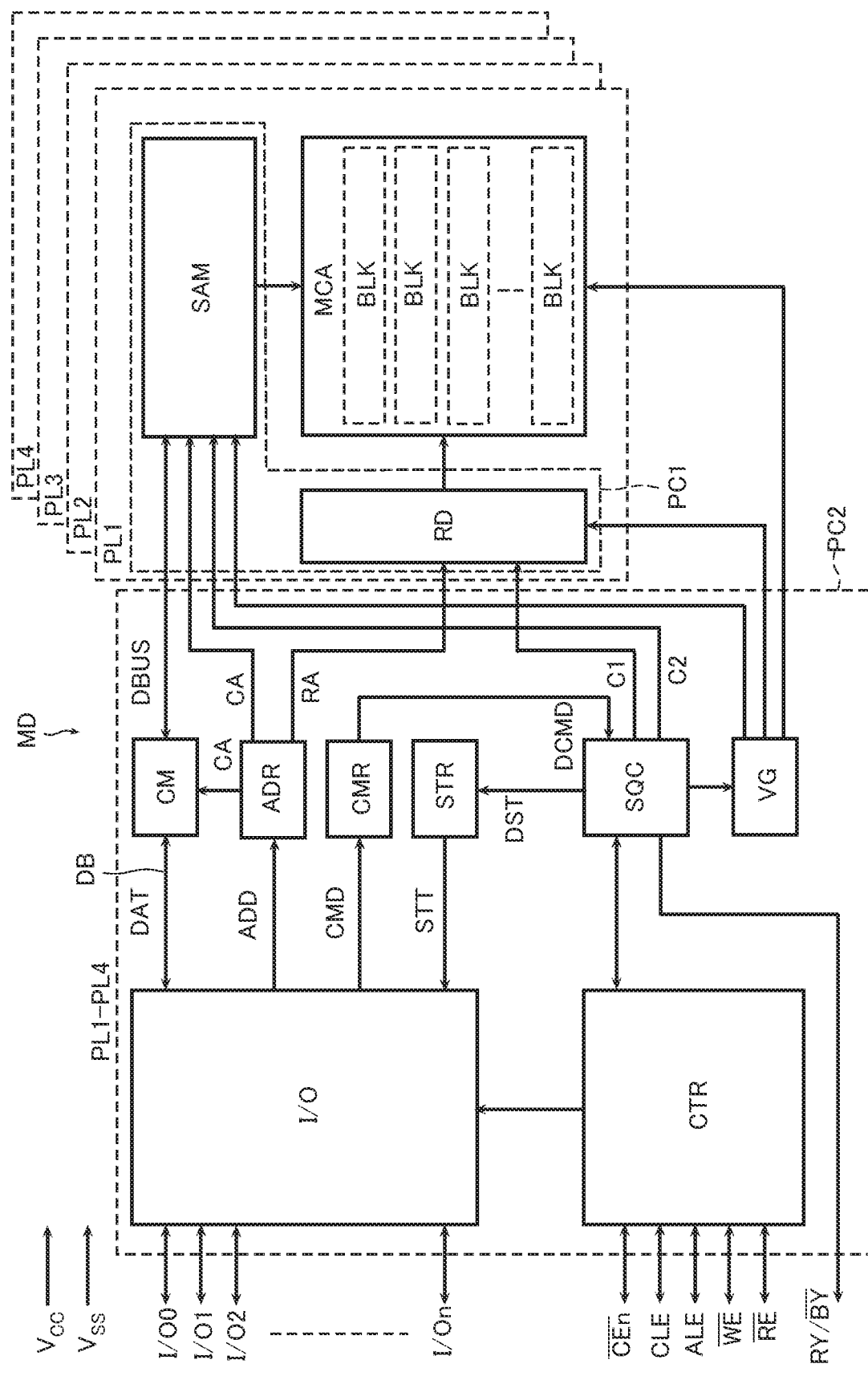
FIG. 1 is a schematic block diagram illustrating a configuration of a part of a semiconductor memory device according to a first embodiment.

A semiconductor memory device according to one embodiment comprises a semiconductor substrate, a wiring layer disposed to be spaced from the semiconductor substrate in a first direction intersecting with the semiconductor substrate, and a memory layer with the wiring layer interposed between the memory layer and the semiconductor substrate in the first direction. The semiconductor substrate includes a first circuit region that includes a first circuit, a second circuit region that includes a second circuit, and a third circuit region that includes a third circuit. The first circuit region, the second circuit region and the third circuit region are disposed in a second direction intersecting with the first direction. The wiring layer includes a first boundary region that includes a first boundary as a boundary between the first circuit region and the second circuit region adjacent in the second direction as viewed in the first direction, a second boundary region that includes a second boundary as a boundary between the second circuit region and the third circuit region adjacent in the second direction as viewed in the first direction, and a passing wiring region between the first boundary region and the second boundary region. The first boundary region includes a first wiring group, the second boundary region includes a second wiring group, and the passing wiring region includes a passing wiring group that passes through the second circuit region in a third direction intersecting with the first direction and the second direction as viewed in the first direction. The first wiring group, the second wiring group, and the passing wiring group are disposed in a same layer where positions in the first direction of the first wiring group, the second wiring group, and the passing wiring group are same. A wiring disposed in a same layer as the passing wiring group and electrically connected to the second circuit in the second circuit region is included in any one of the first wiring group and the second wiring group.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, when referring to a "width", a "length", a "thickness", or the like of a configuration, a member, or the like in a predetermined direction, this may mean a width, a length, a thickness, or the like in a cross-sectional surface or the like observed with a Scanning electron microscopy (SEM), a Transmission electron microscopy (TEM), or the like.

First Embodiment

[Circuit Configuration of Memory Die MD]

FIG. 1 is a schematic block diagram illustrating a configuration of the memory die MD. FIG. 1 illustrates a plurality of control terminals and the like. These plurality of control terminals are represented as control terminals corresponding to a high active signal (a positive logic signal) in some cases, represented as control terminals corresponding to a low active signal (a negative logic signal) in some cases, and represented as control terminals corresponding to both the high active signal and the low active signal in some cases. In FIG. 1, a reference sign of the control terminal corresponding to the low active signal includes an over line (overbar). In this specification, a reference sign of the control terminal corresponding to the low active signal includes a slash ("/"). The description of FIG. 1 is an example, and specific aspects are appropriately adjustable. For example, a part of or all of the high active signals can be changed to the low active signals, or a part of or all of the low active signals can be changed to the high active signals.

As illustrated in FIG. 1, the memory die MD includes a memory cell array MCA that stores data, a first peripheral circuit PC1 connected to the memory cell array MCA, and a second peripheral circuit PC2 connected to the memory cell array MCA and the first peripheral circuit PC1. The memory die MD in this example includes four planes PL1, PL2, PL3, PL4. Each of the planes PL1 to PL4 includes the memory cell array MCA and the first peripheral circuit PC1. The first peripheral circuit PC1 includes a row decoder RD and a sense amplifier module SAM. The second peripheral circuit PC2 includes a voltage generation circuit VG and a sequencer SQC. The second peripheral circuit PC2 further includes a cache memory CM, an address register ADR, a command register CMR, and a status register STR. Additionally, the second peripheral circuit PC2 includes an input/output control circuit I/O and a logic circuit CTR. The second peripheral circuits PC2 are dispersedly disposed in the four planes PL1 to PL4.

[Circuit Configuration of Memory Cell Array MCA]

Figure 2:
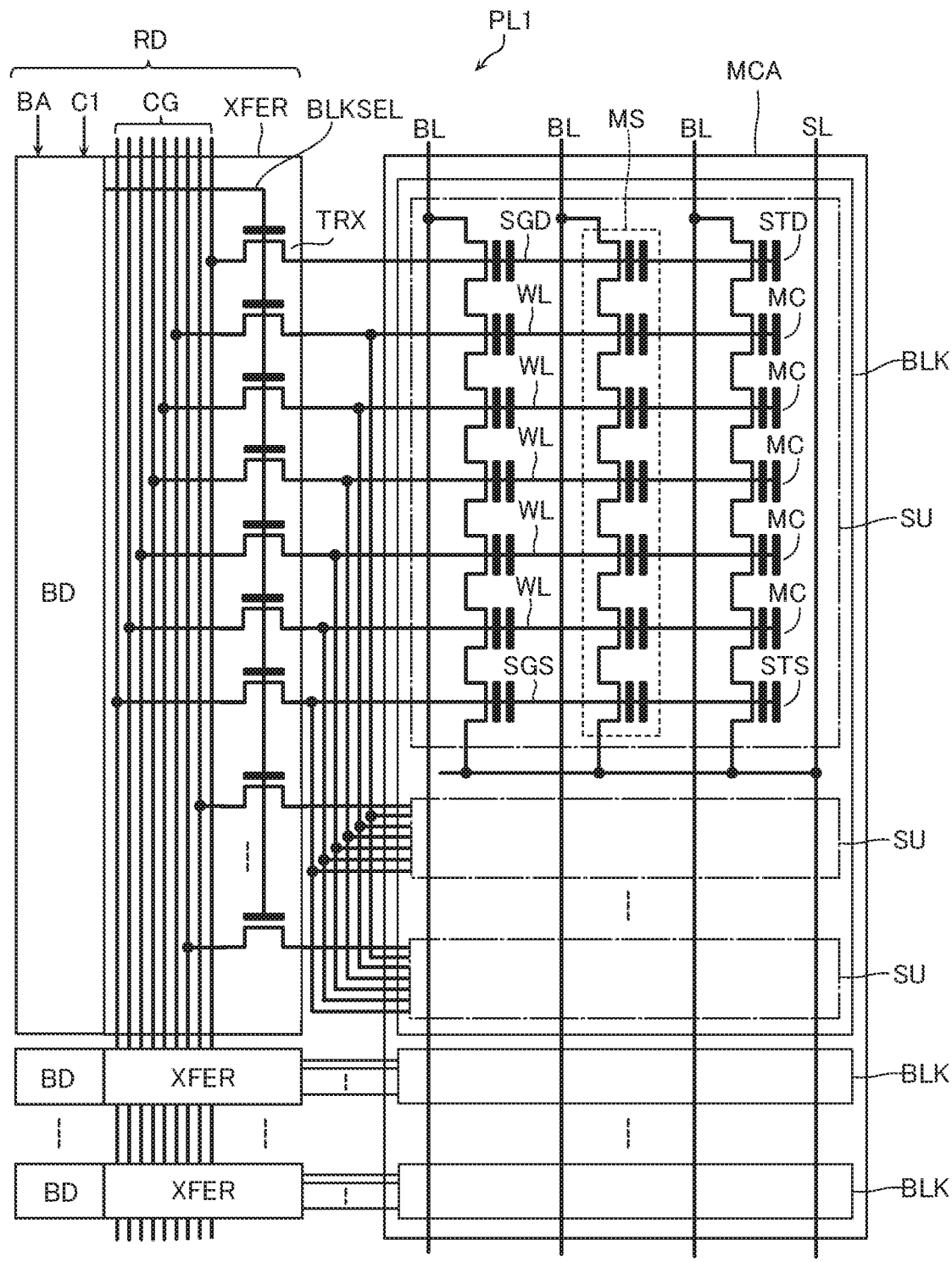
FIG. 2 is a circuit diagram illustrating a configuration of a part of a plane PL1 of the semiconductor memory device.

FIG. 2 is a schematic circuit diagram illustrating a configuration of a part of the plane PL1 in FIG. 1. Note that the other planes PL2 to PL4 are configured similarly to the plane PL1. As illustrated in FIG. 2, the memory cell array MCA includes a plurality of memory blocks BLK. Each of these plurality of memory blocks BLK includes a plurality of string units SU. Each of these plurality of string units SU includes a plurality of memory strings MS. Each of these plurality of memory strings MS has one end connected to the sense amplifier module SAM in the first peripheral circuit illustrated in FIG. 1 via a bit line BL. Additionally, each of these plurality of memory strings MS has the other end connected to the second peripheral circuit PC2 illustrated in FIG. 1 via a common source line SL.

The memory string MS includes a drain-side select transistor STD, a plurality of memory cells MC, and a source-side select transistor STS, which are connected in series between the bit line BL and the source line SL. Hereinafter, the drain-side select transistor STD and the source-side select transistor STS are simply referred to as select transistors (STD, STS) in some cases.

The memory cell MC is a field-effect type transistor that includes a semiconductor layer functioning as a channel region, a gate insulating film including an electric charge accumulating film, and a gate electrode. The memory cell MC has a threshold voltage that changes according to an electric charge amount in the electric charge accumulating film. The memory cell MC stores the data of one bit or a plurality of bits. Respective word lines WL are connected to the gate electrodes of the plurality of memory cells MC corresponding to one memory string MS. Each of these word lines WL is connected to all the memory strings MS in one memory block BLK in common.

The select transistors (STD, STS) are a field-effect type transistor including a semiconductor layer that functions as a channel region, a gate insulating film, and a gate electrode. The gate electrodes of the select transistors (STD, STS) are connected to select gate lines (SGD, SGS), respectively. The drain-side select gate line SGD is disposed corresponding to the string unit SU and connected to all the memory strings MS in one string unit SU in common. The source-side select gate line SGS is connected to all the memory strings MS in the plurality of string units SU in common.

[Configuration of Voltage Generation Circuit VG]

The voltage generation circuit VG illustrated in FIG. 1 includes, for example, a step down circuit, such as a regulator, and a step up circuit, such as a charge pump circuit. These step down circuit and step up circuit are each connected to a voltage supply line to which a power supply voltage VCC and a ground voltage VSS are applied. For example, the voltage generation circuit VG generates a plurality of operating voltages applied to the bit line BL, the source line SL, the word line WL, and the select gate lines (SGD, SGS) in the read operation, the write operation, and the erase operation on the memory cell array MCA in response to the control signal from the sequencer SQC to simultaneously output the operating voltages to the plurality of voltage supply lines. The operating voltage output to the voltage supply line is appropriately adjusted in response to the control signal from the sequencer SQC.

[Circuit Configuration of Row Decoder RD]

For example, as illustrated in FIG. 2, the row decoder RD includes block decoders BD and transfer gate groups XFER. The block decoder BD, for example, sequentially refers to a row address RA of the address register ADR (FIG. 1) in response to the control signal from the sequencer SQC, decodes a block address BA included in the row address RA, and selectively activates a block select line BLKSEL. The block decoder BD in this example is disposed for each of the memory blocks BLK and includes one block select line BLKSEL. However, this configuration is appropriately changeable. For example, one block decoder BD and one block select line BLKSEL may be disposed in each of the two or more memory blocks BLK.

The transfer gate group XFER includes a plurality of transfer transistors TRX. The plurality of transfer transistors TRX are, for example, field-effect type high breakdown voltage transistors. A drain electrode of the transfer transistor TRX is electrically connected to the corresponding word line WL or the select gate line (SGD, SGS). Each of source electrodes of the transfer transistors TRX is electrically connected to the voltage generation circuit VG (FIG. 1) via a wiring CG and a voltage select circuit (not illustrated). Gate electrodes of the transfer transistors TRX are connected to the corresponding block select line BLKSEL in common.

Note that the block decoder BD further includes a plurality of transistors (not illustrated). These plurality of transistors are field-effect type high breakdown voltage transistors connected between the select gate lines (SGD, SGS) and the voltage generation circuit VG (FIG. 1) to which the ground voltage VSS is applied. These plurality of transistors apply the ground voltage VSS to the select gate lines (SGD, SGS) included in the unselected memory blocks BLK. Note that the plurality of word lines WL included in the unselected memory blocks BLK enter a floating state.

[Circuit Configuration of Sense Amplifier Module SAM]

The sense amplifier module SAM includes, for example, a plurality of sense amplifier units corresponding to the plurality of bit lines BL. The sense amplifier units each include a sense node electrically connected to the bit line BL, a sense transistor electrically connected to the sense node, a data wiring electrically connected to the sense transistor, and a plurality of latch circuit electrically connected to the data wiring. The sense amplifier units each include a voltage transfer circuit electrically connected to the bit line BL and a controlling latch circuit electrically connected to the voltage transfer circuit. The sense node is electrically conducted with the bit line BL at a predetermined timing of the read operation or the like. The sense transistor includes a gate electrode electrically connected to the sense node. The sense transistor turns ON or turns OFF corresponding to the voltage of the sense node. The data wiring is charged or discharged depending on whether the sense transistor is in the ON state or the OFF state. The plurality of latch circuits and the controlling latch circuit latch data of "1" or "0" corresponding to the voltage of the data wiring. The voltage transfer circuit electrically conducts the bit line BL with any one of the two voltage supply lines corresponding to the data latched by the controlling latch circuit.

[Circuit Configuration of Cache Memory CM]

The cache memory CM (FIG. 1) includes a plurality of latch circuits connected to the plurality of latch circuits inside the sense amplifier module SAM via a wiring DBUS. Data DAT included in these plurality of latch circuits is sequentially transferred to the sense amplifier module SAM or the input/output control circuit I/O.

A decode circuit and a switch circuit (not illustrated) are connected to the cache memory CM. The decode circuit decodes a column address CA latched in the address register ADR (FIG. 1). The switch circuit electrically conducts the latch circuit corresponding to the column address CA with a bus DB (FIG. 1) in response to an output signal from the decode circuit.

[Circuit Configuration of Sequencer SQC]

The sequencer SQC (FIG. 1) outputs an internal control signal to the row decoder RD, the sense amplifier module SAM, and the voltage generation circuit VG in accordance with command data DCMD latched in the command register CMR. The sequencer SQC outputs status data DST indicating its own state to the status register STR as necessary.

The sequencer SQC generates a ready/busy signal and outputs it to a terminal RY/(/BY). In a period when the terminal RY/(/BY) is in a state of "L" (busy period), access to the semiconductor memory device is basically inhibited. In a period when the terminal RY/(/BY) is in a state of "H" (ready period), the access to the semiconductor memory device is permitted.

[Circuit Configuration of Input/Output Control Circuit I/O]

The input/output control circuit I/O includes data signal input/output terminals IO0 to IOn, an input circuit, such as a comparator connected to the data signal input/output terminals IO0 to IOn, and an output circuit, such as an Off Chip Driver (OCD) circuit. The input/output control circuit I/O includes a shift register connected to these input circuit and output circuit and a buffer circuit. The input circuit, the output circuit, the shift register, and the buffer circuit are each connected to a terminal to which the power supply voltage VCC and the ground voltage VSS are applied. Data input via the data signal input/output terminals IO0 to IOn are output from the buffer circuit to the cache memory CM, the address register ADR, or the command register CMR in response to the internal control signal from the logic circuit CTR. Data output via the data signal input/output terminals 100 to IOn are input to the buffer circuit from the cache memory CM or the status register STR in response to the internal control signal from the logic circuit CTR.

[Circuit Configuration of Logic Circuit CTR]

The logic circuit CTR (FIG. 1) receives an external control signal from a controller via external control terminals/CEn, CLE, ALE, /WE, /RE and outputs the internal control signal to the input/output control circuit I/O in response thereto.

[Structure of Memory Die MD]

Figure 3:
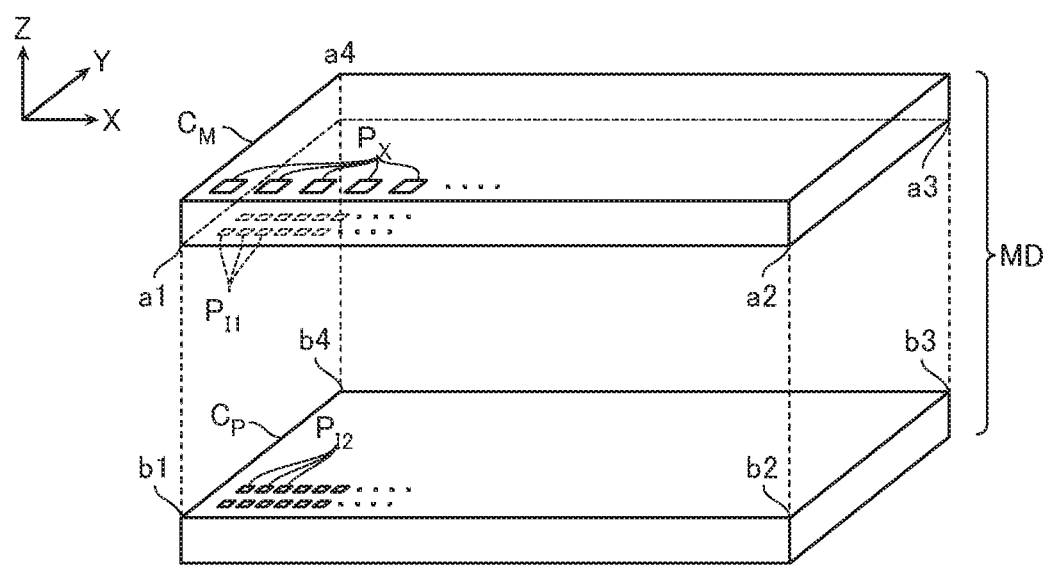
FIG. 3 is a schematic exploded perspective view illustrating an exemplary configuration of the semiconductor memory device.

FIG. 3 is a schematic exploded perspective view illustrating an exemplary configuration of the semiconductor memory device according to the embodiment. As illustrated in FIG. 3, the memory die MD includes a chip $C_M$ on the memory cell array MCA side and a chip $C_P$ on the side of the first peripheral circuit PC1 and the second peripheral circuit PC2.

On the upper surface of the chip $C_M$, a plurality of external pad electrodes $P_X$ connectable to bonding wires (not illustrated) are disposed. On the lower surface of the chip $C_M$, a plurality of bonding electrodes $P_{I1}$ are disposed. On the upper surface of the chip $C_P$, a plurality of bonding electrodes $P_{I2}$ are disposed. Hereinafter, regarding the chip $C_M$, a surface on which the plurality of bonding electrodes Pu are disposed is referred to as a front surface and a surface on which the plurality of external pad electrodes $P_X$ are disposed is referred to as a back surface. Regarding the chip $C_P$, a surface on which the plurality of bonding electrodes $P_{I2}$ are disposed is referred to as a front surface and a surface on the side opposite to the front surface is referred to as a back surface. In the illustrated example, the front surface of the chip $C_P$ is disposed above the back surface of the chip $C_P$ and the back surface of the chip $C_M$ is disposed above the front surface of the chip $C_M$.

In the chip $C_M$ and the chip $C_P$, the surface of the chip $C_M$ is disposed to be opposed to the surface of the chip $C_P$. The respective plurality of bonding electrodes $P_{I1}$ are disposed corresponding to the plurality of bonding electrodes $P_{I2}$ and are disposed at positions where the plurality of bonding electrodes Pu can be bonded to the plurality of bonding electrodes $P_{I2}$. The bonding electrode $P_{I1}$ and the bonding electrode $P_{I2}$ function as bonding electrodes to bond the chip $C_M$ and the chip $C_P$ together to electrically conduct them.

In the example of FIG. 3, corner portions a1, a2, a3, a4 of the chip $C_M$ correspond to corner portions b1, b2, b3, b4 of the chip $C_P$, respectively.

Figure 4:
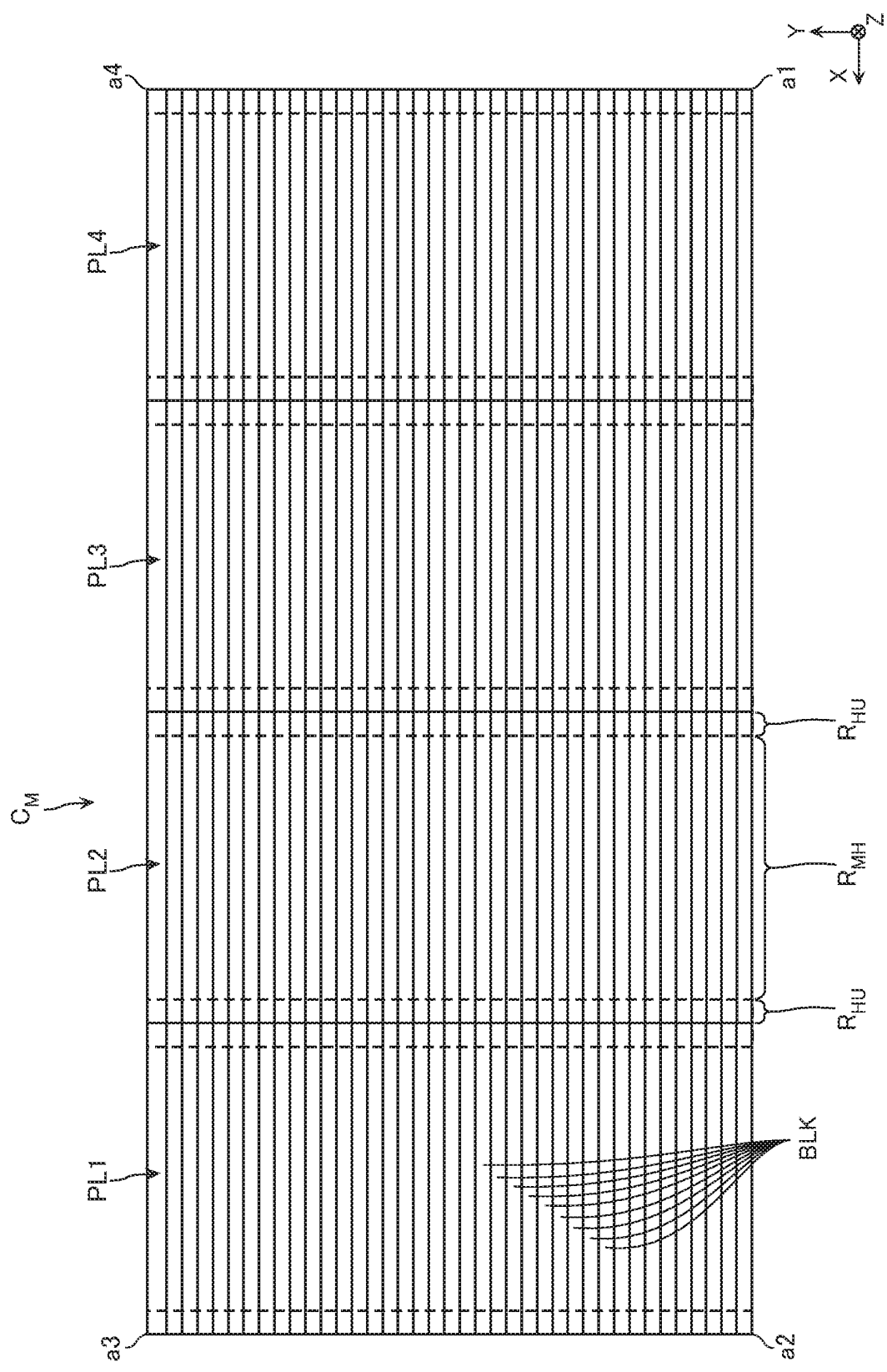
FIG. 4 is a schematic bottom view illustrating an exemplary configuration of a chip $C_M$.
Figure 5:
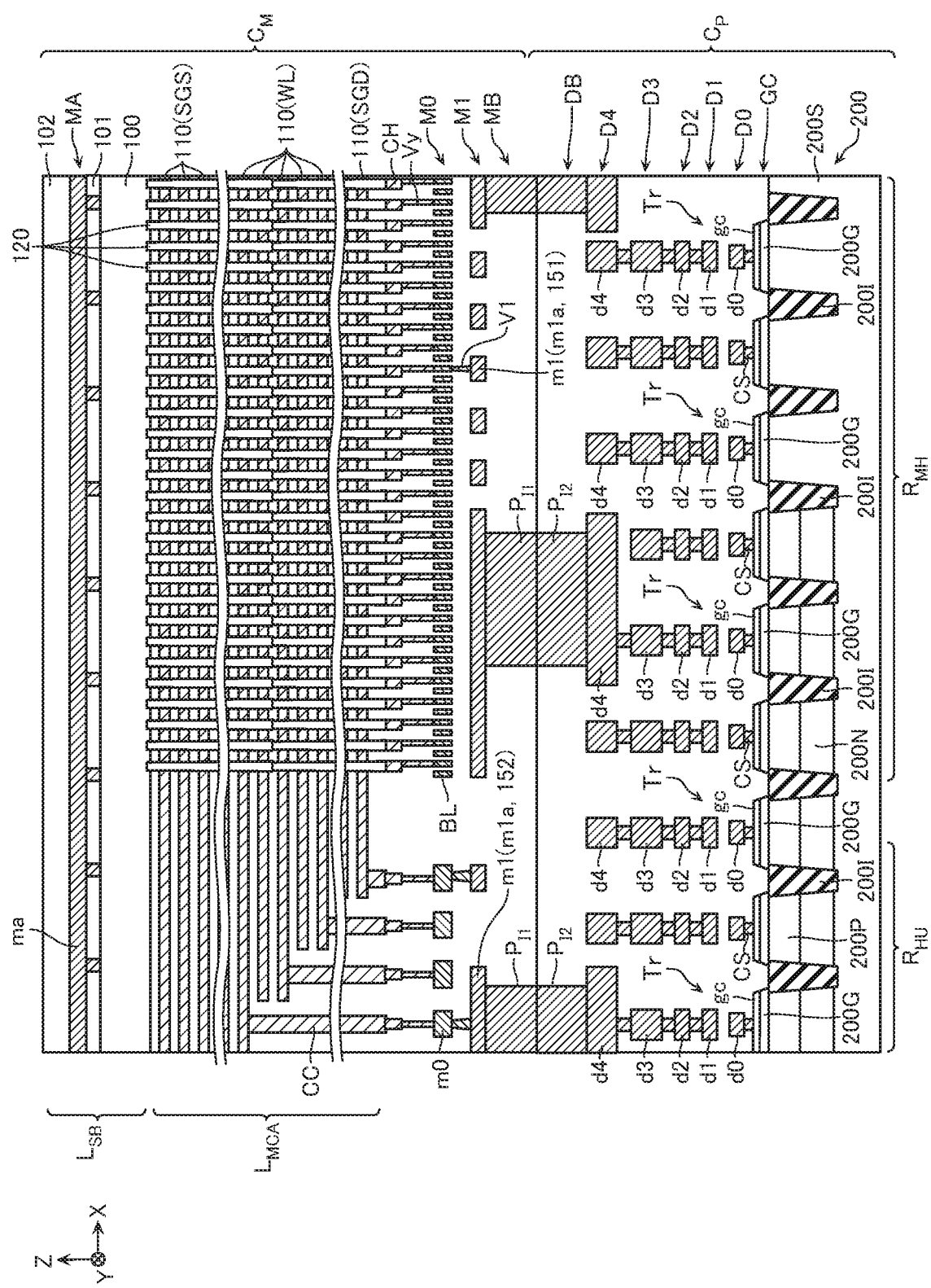
FIG. 5 is a schematic cross-sectional view illustrating a configuration of a part of a memory die MD.

FIG. 4 is a schematic bottom view illustrating an exemplary configuration of the chip $C_M$. FIG. 4 omits a part of the configuration, such as the bonding electrodes $P_{I1}$. FIG. 5 is a schematic cross-sectional view illustrating the configuration of a part of the memory die MD.

[Structure of Chip $C_M$]

In the example of FIG. 4, the chip $C_M$ includes the four planes PL1, PL2, PL3, PL4 aligned in the X-direction. Each of these four planes PL1 to PL4 includes the plurality of memory blocks BLK arranged in the Y-direction. In the example of FIG. 4, each of the plurality of memory blocks BLK includes hook-up regions $R_{HU}$ disposed at both end portions in the X-direction and a memory hole region $R_{MH}$ disposed between them.

Note that in the illustrated example, the hook-up regions $R_{HU}$ are disposed at both end portions in the X-direction of the memory hole region $R_{MH}$. However, the configuration is merely an example, and a specific configuration is appropriately adjustable. For example, the hook-up region Rau may be disposed, not at both end portions in the X-direction of the memory hole region $R_{MH}$, but the hook-up region $R_{HU}$ may be disposed at one end portion in the X-direction. Alternatively, the hook-up region Rau may be disposed at the center position in the X-direction of the memory hole region $R_{MH}$ or at a position near the center.

For example, as illustrated in FIG. 5, the chip $C_M$ includes a substrate layer $L_{SB}$, a memory cell array layer $L_{MCA}$ disposed below the substrate layer $L_{SB}$, and a plurality of wiring layers CH, M0, M1, MB disposed below the memory cell array layer $L_{MCA}$.

[Structure of Substrate Layer $L_{SB}$ in Chip $C_M$]

For example, as illustrated in FIG. 5, the substrate layer $L_{SB}$ includes a conductive layer 100 disposed on the upper surface of the memory cell array layer $L_{MCA}$, an insulating layer 101 disposed on the upper surface of the conductive layer 100, a back side wiring layer MA disposed on the upper surface of the insulating layer 101, and an insulating layer 102 disposed on the upper surface of the back side wiring layer MA.

The conductive layer 100, for example, may contain a semiconductor layer, such as silicon (Si), into which N-type impurities, such as phosphorus (P), or P-type impurities, such as boron (B), are implanted, may contain a metal, such as tungsten (W), or may contain silicide, such as tungsten silicide (wSi).

The conductive layer 100 functions as a part of the source line SL (FIG. 2). The four conductive layers 100 are disposed corresponding to the four planes PL1 to PL4 (FIG. 4).

The insulating layer 101 contains, for example, silicon oxide ($SiO_2$).

The back side wiring layer MA includes a plurality of wirings ma. These plurality of wirings ma may contain, for example, aluminum (Al).

A part of the plurality of wirings ma functions as a part of the source line SL (FIG. 2). The four wirings ma are disposed corresponding to the four planes PL1 to PL4 (FIG. 4). Each of the wirings ma is electrically connected to the conductive layer 100. A part of the plurality of wirings ma is exposed to outside to function as the external pad electrodes $P_X$ (FIG. 3).

The insulating layer 102 is, for example, a passivation layer made of an insulating material, such as polyimide.

[Structure of Chip $C_H$ in Memory Hole Region $R_{MH}$ Of Memory Cell Array Layer $L_{MCA}$]

Figure 6:
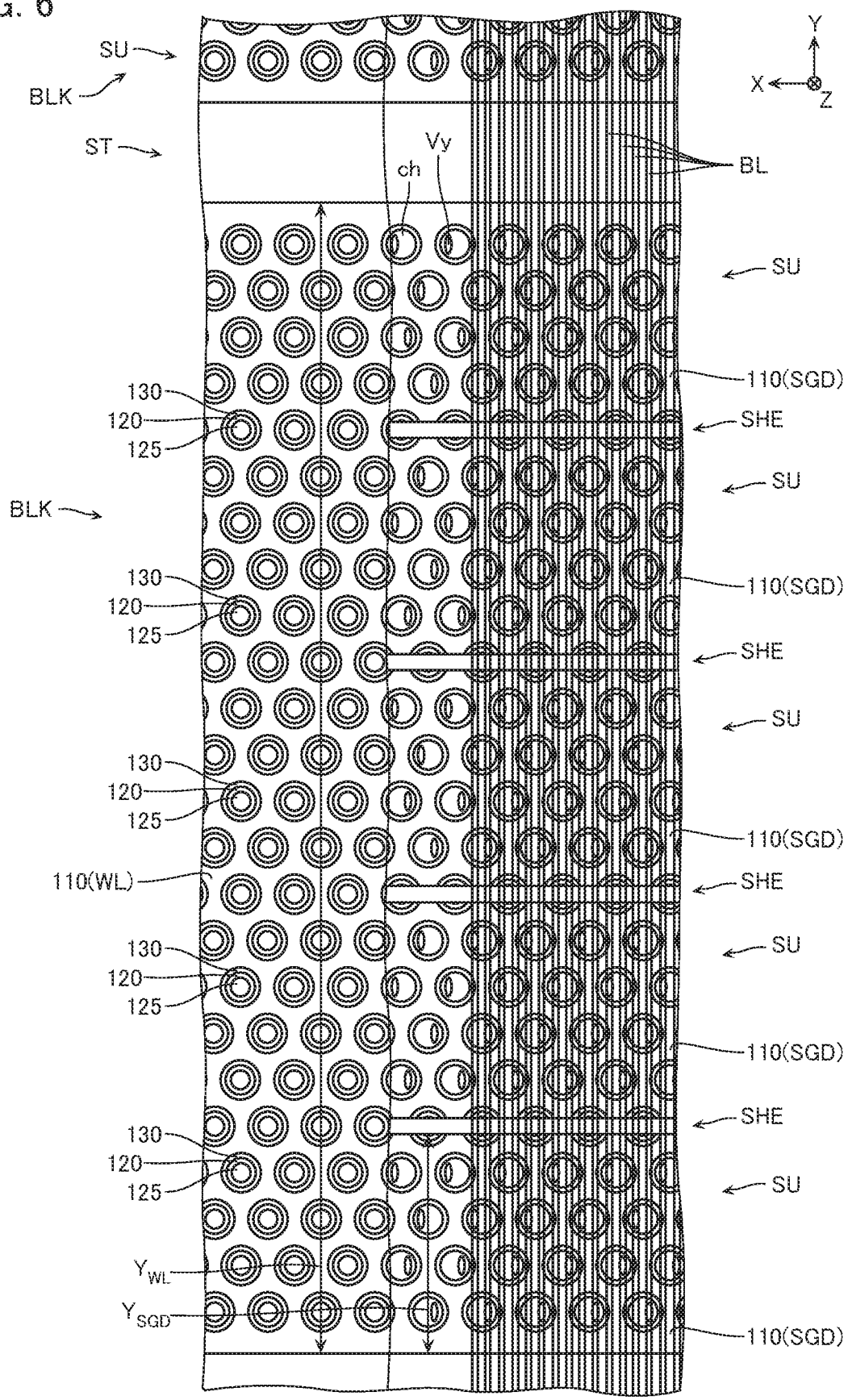
FIG. 6 is a schematic bottom view illustrating a configuration of a part of the chip $C_M$.

FIG. 6 is a schematic cross-sectional view corresponding to a part of the bottom view illustrated in FIG. 4 and illustrating an X-Y cross-sectional surface at a different position in the Z-direction enlarged to right and left. As illustrated in FIG. 6, between two memory blocks BLK adjacent in the Y-direction, an inter-block insulating layer ST, such as silicon oxide ($SiO_2$), is disposed.

Figure 7:
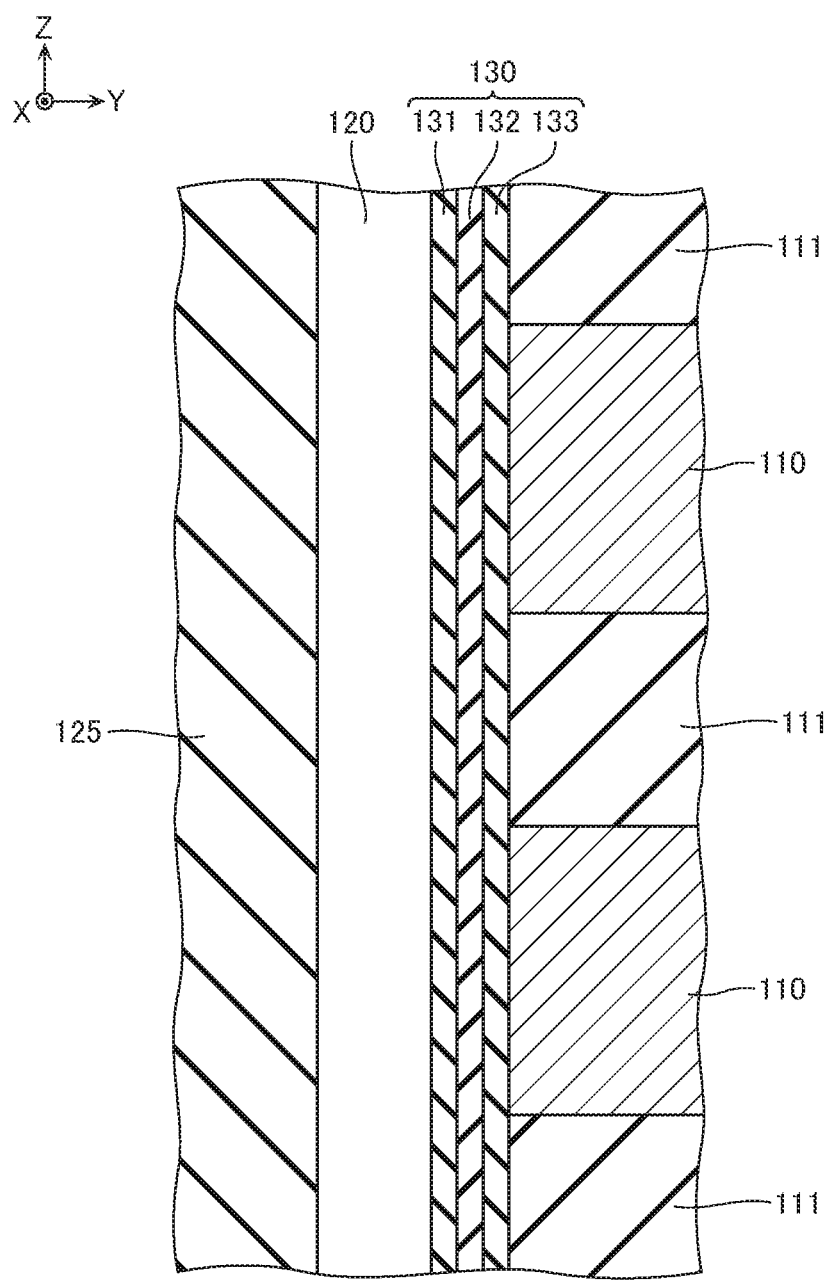
FIG. 7 is a schematic cross-sectional view illustrating a configuration of a part of the chip $C_M$.

FIG. 7 is an enlarged cross-sectional view illustrating a part of FIG. 5 with the direction changed. Note that while FIG. 7 illustrates a Y-Z cross-sectional surface, in a case where the cross-sectional surface other than the Y-Z cross-sectional surface along a center axis of a semiconductor layer 120 (for example, an X-Z cross-sectional surface) is observed, the structure similar to that in FIG. 7 is observed.

For example, as illustrated in FIG. 5 and FIG. 7, the memory block BLK includes a plurality of conductive layers 110 arranged in the Z-direction and the plurality of semiconductor layers 120 extending in the Z-direction. Additionally, as illustrated in FIG. 7, respective gate insulating films 130 are disposed between the plurality of conductive layers 110 and the plurality of semiconductor layers 120.

The conductive layer 110 has an approximately plate shape extending in the X-direction. The conductive layer 110 may include, for example, a stacked film of a barrier conductive film of titanium nitride (TiN) or the like and a metal film of tungsten (W) or the like. The conductive layer 110 may contain, for example, polycrystalline silicon containing impurities, such as phosphorus (P) or boron (B). Between the plurality of conductive layers 110 arranged in the Z-direction, an interlayer insulating layer 111 of silicon oxide ($SiO_2$) or the like is disposed.

Among the plurality of conductive layers 110, one or plurality of conductive layers 110 positioned on the uppermost layer function as a gate electrode of the source-side select transistor STS (FIG. 2) and the source-side select gate line SGS (see FIG. 5). These plurality of conductive layers 110 are electrically independent in every memory block BLK.

Additionally, a plurality of conductive layers 110 positioned below this conductive layer 110 function as a gate electrode of the memory cell MC (FIG. 2) and the word line WL. Each of these plurality of conductive layers 110 is electrically independent in every memory block BLK.

One or plurality of conductive layers 110 positioned below the conductive layers 110 function as a gate electrode of the drain-side select transistor STD and the drain-side select gate line SGD. For example, as illustrated in FIG. 6, a width $Y_{SGD}$ in the Y-direction of these plurality of conductive layers 110 is smaller than a width $Y_{WL}$ in the Y-direction of the conductive layers 110 that function as the word lines WL. Between two conductive layers 110 adjacent in the Y-direction, an insulating layer SHE, such as silicon oxide ($SiO_2$), is disposed.

For example, as illustrated in FIG. 6, the semiconductor layers 120 are arranged in a predetermined pattern in the X-direction and the Y-direction. The respective semiconductor layers 120 function as the channel regions of the plurality of memory cells MC and the select transistors (STD, STS) included in one memory string MS (FIG. 1). The semiconductor layer 120 contains, for example, polycrystalline silicon (Si). The semiconductor layer 120 has a substantially cylindrical shape and includes an insulating layer 125, such as silicon oxide, in the center portion. The outer peripheral surfaces of the semiconductor layers 120 are each surrounded by the plurality of conductive layers 110 and opposed to these plurality of conductive layers 110.

Additionally, on the upper end of the semiconductor layer 120, an impurity region (not illustrated) is disposed. The impurity region is connected to the conductive layer 100 (see FIG. 5). The impurity region, for example, contains N-type impurities, such as phosphorus (P), and P-type impurities, such as boron (B).

On the lower end of the semiconductor layer 120, an impurity region (not illustrated) is disposed. The impurity region is connected to the bit line BL via a via-contact electrode ch and a via-contact electrode Vy. The impurity region contains N-type impurities, such as phosphorus (P).

For example, as illustrated in FIG. 6, the gate insulating film 130 has an approximately cylindrical shape covering the outer peripheral surface of the semiconductor layer 120. For example, as illustrated in FIG. 7, the gate insulating film 130 includes a tunnel insulating film 131, an electric charge accumulating film 132, and a block insulating film 133, which are stacked between the semiconductor layer 120 and the conductive layers 110. The tunnel insulating film 131 and the block insulating film 133 contain, for example, silicon oxide ($SiO_2$). The electric charge accumulating film 132 includes, for example, a film of silicon nitride (SiN) or the like that can accumulate an electric charge. The tunnel insulating film 131, the electric charge accumulating film 132, and the block insulating film 133 have an approximately cylindrical shape, and extend in the Z-direction along the outer peripheral surface of the semiconductor layer 120 excluding a contact portion of the semiconductor layer 120 with the conductive layer 100.

Note that FIG. 7 illustrates an example of the gate insulating film 130 including the electric charge accumulating film 132, such as silicon nitride. However, the gate insulating film 130, for example, may include a floating gate of polycrystalline silicon or the like containing N-type or P-type impurities.

[Structure of Chip $C_H$ in Hook-Up Region $R_{HU}$ of Memory Cell Array Layer $L_{MCA}$]

As illustrated in FIG. 5, the hook-up region $R_{HU}$ includes a plurality of via-contact electrodes CC. Each of these plurality of via-contact electrodes CC extends in the Z-direction and has an upper end connected to the conductive layer 110.

[Structure of Wiring Layers CH, M0, M1, MB in Chip $C_M$]

A plurality of wirings included in the wiring layers CH, M0, M1, MB are, for example, electrically connected to at least one of a configuration in the memory cell array layer $L_{MCA}$ and a configuration in the chip $C_P$.

The wiring layer CH includes the plurality of via-contact electrodes ch as the plurality of wirings. These plurality of via-contact electrodes ch may include, for example, a stacked film of a barrier conductive film of titanium nitride (TiN) or the like and a metal film of tungsten (W) or the like. The via-contact electrodes ch are disposed corresponding to the plurality of semiconductor layers 120 and are connected to the lower ends of the plurality of semiconductor layers 120.

The wiring layer M0 includes a plurality of wirings m0. For example, these plurality of wirings m0 may include a stacked film of a barrier conductive film, such as titanium nitride (TiN), and a metal film, such as copper (Cu). Note that a part of the plurality of wirings m0 function as the bit lines BL. For example, as illustrated in FIG. 6, the bit lines BL are arranged in the X-direction and extend in the Y-direction.

For example, as illustrated in FIG. 5, the wiring layer M1 includes a plurality of wirings m1. These plurality of wirings m1 may include, for example, a stacked film of a barrier conductive film of titanium nitride (TiN) or the like and a metal film of tungsten (W) or the like. Note that a wiring pattern in the wiring layer M1 will be described later.

The wiring layer MB includes the plurality of bonding electrodes $P_{I1}$ These plurality of bonding electrodes $P_{I1}$ may include, for example, a stacked film of a barrier conductive film, such as titanium nitride (TiN), and a metal film, such as copper (Cu).

[Structure of Chip $C_P$]

Figure 8:
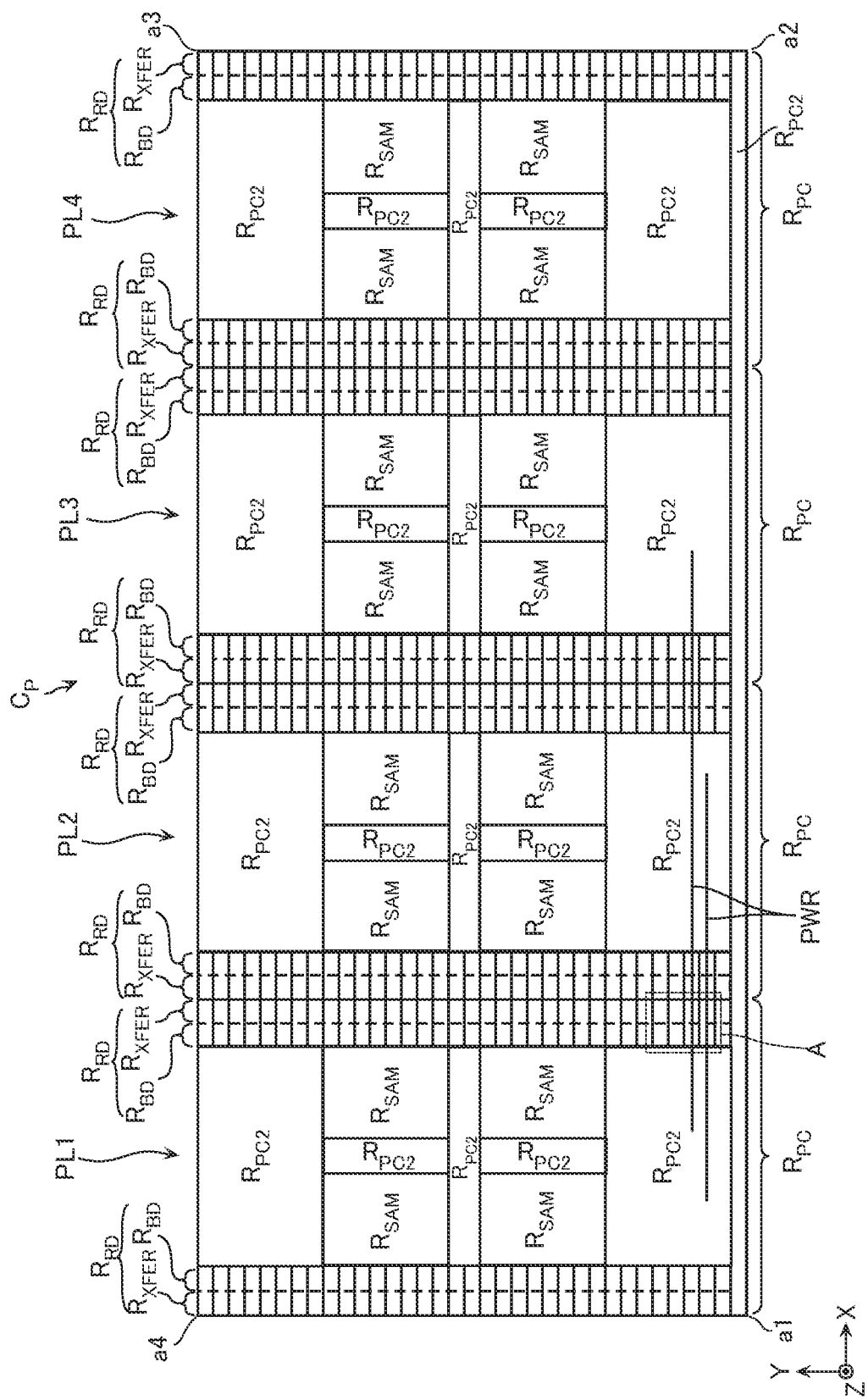
FIG. 8 is a schematic plan view illustrating an exemplary configuration of a chip $C_P$.

FIG. 8 is a schematic plan view illustrating an exemplary configuration of the chip $C_P$. FIG. 8 omits a part of the configuration, such as the bonding electrodes $P_{I2}$.

For example, as illustrated in FIG. 8, the chip $C_P$ includes four peripheral circuit regions $R_{PC}$ arranged in the X-direction corresponding to the planes PL1 to PL4. Row decoder regions $R_{RD}$ are disposed in respective both end portions in the X-direction of these four peripheral circuit regions $R_{PC}$. The row decoder region $R_{RD}$ includes the row decoder RD illustrated in FIG. 1. The row decoder region $R_{RD}$ includes a block decoder region $R_{BD}$ inside and a transfer gate group region $R_{XFER}$ outside. Note that the block decoder region $R_{BD}$ may be disposed outside, and the transfer gate group region $R_{XFER}$ may be disposed inside. The block decoder region $R_{BD}$ and the transfer gate group region $R_{XFER}$ include the block decoders BD and the transfer gate groups XFER illustrated in FIG. 1, respectively. Additionally, between the row decoder regions $R_{RD}$ adjacent in the X-direction, respective second peripheral circuit regions $R_{PC2}$ and sense amplifier module regions $R_{SAM}$ having predetermined areas are dispersively disposed in the X-direction and the Y-direction. As illustrated in the drawing, second peripheral circuits $R_{PC2}$ continuous in the X-direction are disposed at one end portions in the Y-direction. The second peripheral circuit regions $R_{PC2}$ dispersively include, for example, the voltage generation circuits VG, the sequencers SQC, the cache memories $C_M$, the address registers ADR, the command registers CMR, the status registers STR, the input/output control circuits I/O, and the logic circuits CTR illustrated in FIG. 1. The sense amplifier module regions $R_{SAM}$ include the sense amplifier modules SAM illustrated in FIG. 1 that read/write data from/to the memory cell arrays MCA in the corresponding planes PL1 to PL4.

For example, as illustrated in FIG. 5, the chip $C_P$ includes a semiconductor substrate 200, an electrode layer GC disposed above the semiconductor substrate 200, and wiring layers D0, D1, D2, D3, D4, DB disposed above the electrode layer GC.

[Structure of Semiconductor Substrate 200 in Chip $C_P$]

The semiconductor substrate 200, for example, contains P-type silicon (Si) containing P-type impurities, such as boron (B). On the surface of the semiconductor substrate 200, for example, N-type well regions 200N containing N-type impurities, such as phosphorus (P), P-type well regions 200P containing P-type impurities, such as boron (B), semiconductor substrate regions 200S where the N-type well regions 200N or the P-type well regions 200P are not disposed, and insulating regions 200I are disposed. The respective N-type well regions 200N, P-type well regions 200P, and the semiconductor substrate regions 200S function as a part of the plurality of transistors Tr, a plurality of capacitors, and the like constituting the first peripheral circuit PC1 and the second peripheral circuit PC2.

[Structure of Electrode Layer GC in Chip $C_P$]

The electrode layer GC is disposed on the upper surface of the semiconductor substrate 200 via insulating layers 200G. The electrode layer GC includes a plurality of electrodes gc opposed to the surface of the semiconductor substrate 200. Each region of the semiconductor substrate 200 and each of the plurality of electrodes gc included in the electrode layer GC are connected to a via-contact electrode CS.

The respective plurality of electrodes gc included in the electrode layer GC function as the gate electrodes of the plurality of transistors Tr constituting the first peripheral circuit PC1 and the second peripheral circuit PC2, electrodes of the plurality of capacitors, and the like.

The via-contact electrode CS extends in the Z-direction and has a lower end connected to the semiconductor substrate 200 or the upper surface of the electrode gc. In a connection part between the via-contact electrode CS and the semiconductor substrate 200, an impurity region containing N-type impurities or P-type impurities is disposed. The via-contact electrode CS may include, for example, a stacked film of a barrier conductive film of titanium nitride (TiN) or the like and a metal film of tungsten (W) or the like.

[Structure of Wiring Layers D0, D1, D2, D3, D4, DB in Chip $C_P$]

For example, as illustrated in FIG. 5, a plurality of wirings included in the wiring layers D0, D1, D2, D3, D4, DB are, for example, electrically connected to at least one of a configuration in the memory cell array layer $L_{MCA}$ and a configuration in the chip $C_P$.

The wiring layers D0, D1, D2 include a plurality of wirings d0, d1, d2, respectively. These plurality of wirings d0, d1, d2 may include, for example, a stacked film of a barrier conductive film of titanium nitride (TiN) or the like and a metal film of tungsten (W) or the like.

The wiring layers D3, D4 include a plurality of wirings d3, d4, respectively. These plurality of wirings d3, d4, for example, may include a stacked film of a barrier conductive film, such as titanium nitride (TiN), and a metal film, such as copper (Cu).

The wiring layer DB includes the plurality of bonding electrodes $P_{I2}$. These plurality of bonding electrodes $P_{I2}$, for example, may include a stacked film of a barrier conductive film, such as titanium nitride (TiN), and a metal film, such as copper (Cu).

[Configuration of Row Decoder RD]

As illustrated in FIG. 8, the block decoder region $R_{BD}$ in the row decoder region $R_{RD}$ includes the block decoder BD illustrated in FIG. 2. Additionally, the transfer gate group region $R_{XFER}$ includes the transfer gate group XFER illustrated in FIG. 2. At least a part of the row decoder region $R_{RD}$ and the hook-up region Rau illustrated in FIG. 4 overlap in the vertical direction and are mutually electrically connected via the wirings d0 to d4 in the wiring layers D0 to D4, the bonding electrodes $P_{I2}$, $P_{I1}$ in the wiring layers DB, MB, and the wirings m1, m0 in the wiring layers M1, M0.

As illustrated in FIG. 8, the block decoder region $R_{BD}$ and the transfer gate group region $R_{XFER}$ are disposed at approximately full width in the Y-direction of each of the planes PL1 to PL4. In view of this, for electrical connection between circuit elements in the second peripheral circuit regions $R_{PC2}$ disposed in the different planes PL1 to PL4, passing wirings PWR are disposed so as to pass through the block decoder regions $R_{BD}$ and the transfer gate group regions $R_{XFER}$ in the X-direction.

Figure 9:
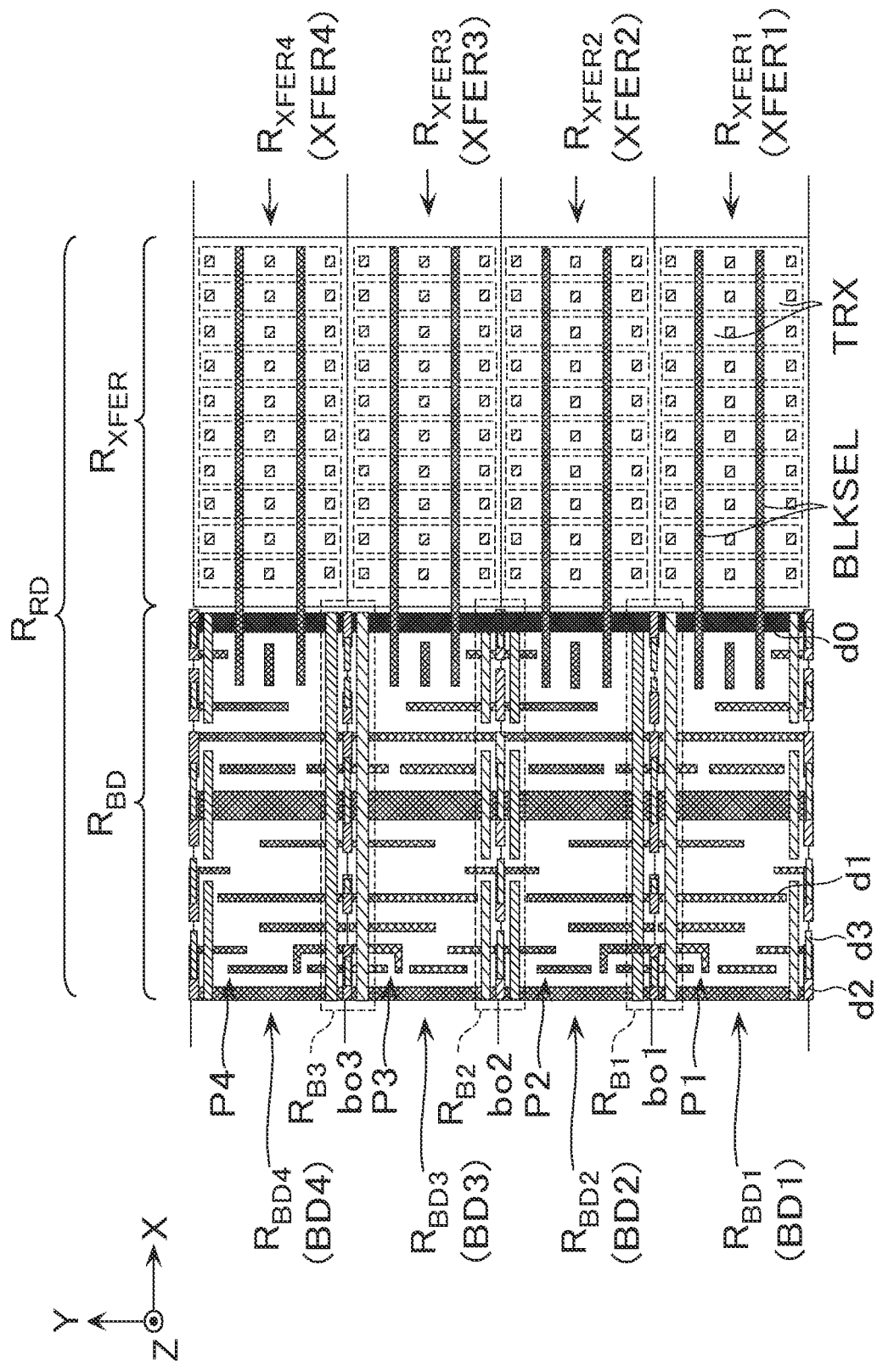
FIG. 9 is an enlarged schematic plan view illustrating a part of FIG. 8.
Figure 10:
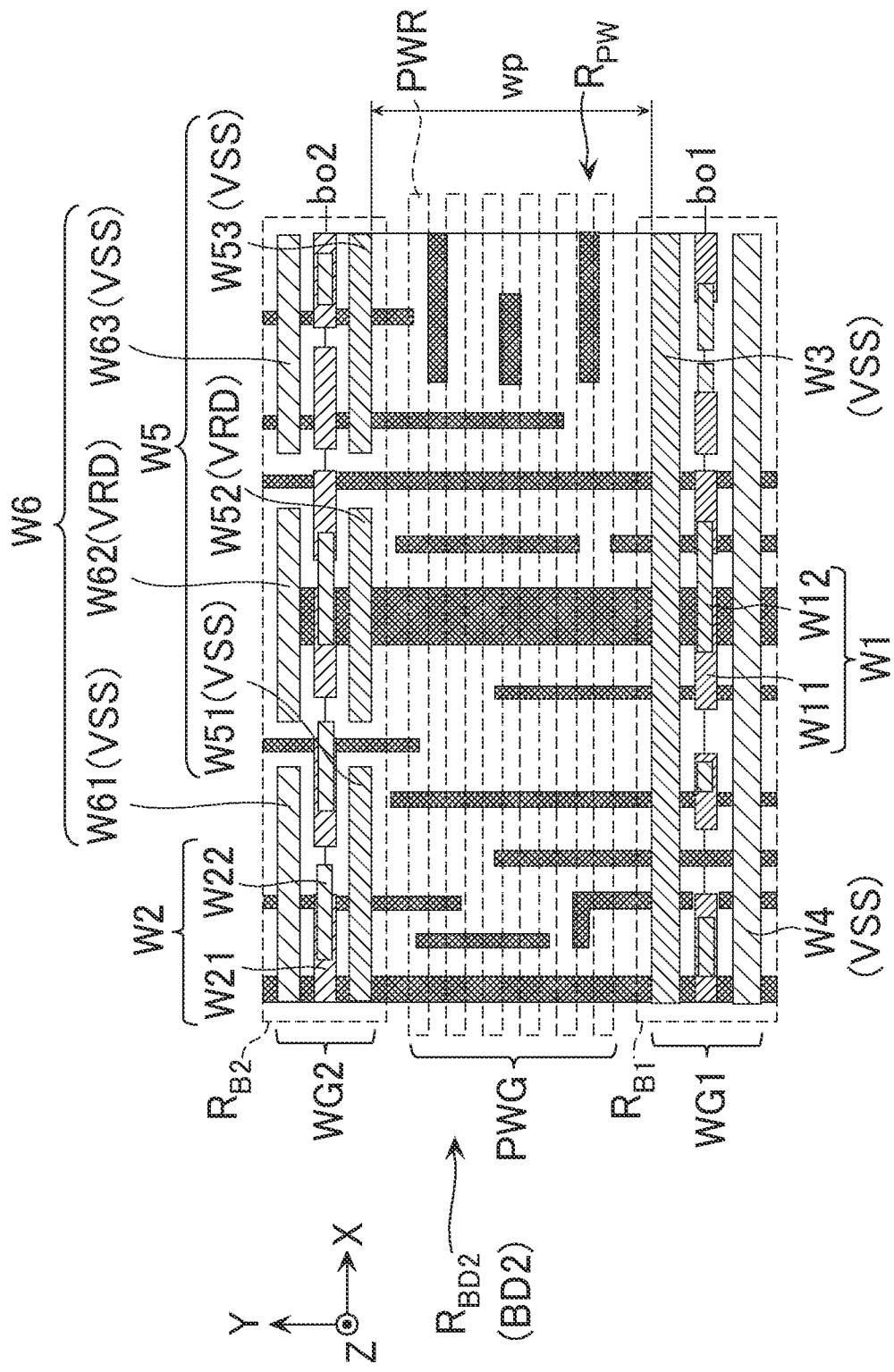
FIG. 10 is an enlarged schematic plan view illustrating a part of FIG. 9.
Figure 11:
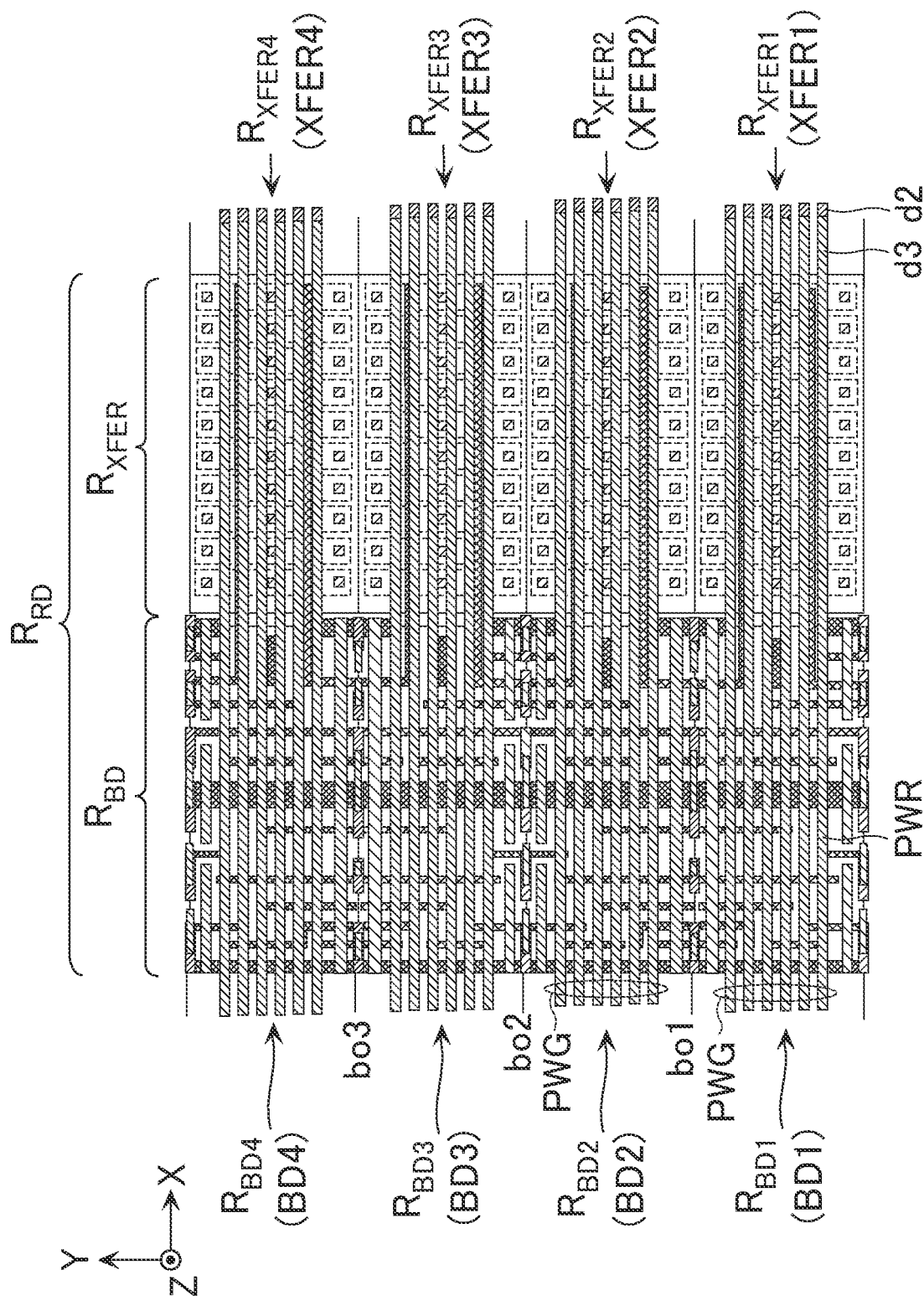
FIG. 11 is an enlarged schematic plan view illustrating a part of FIG. 8.
Figure 12:
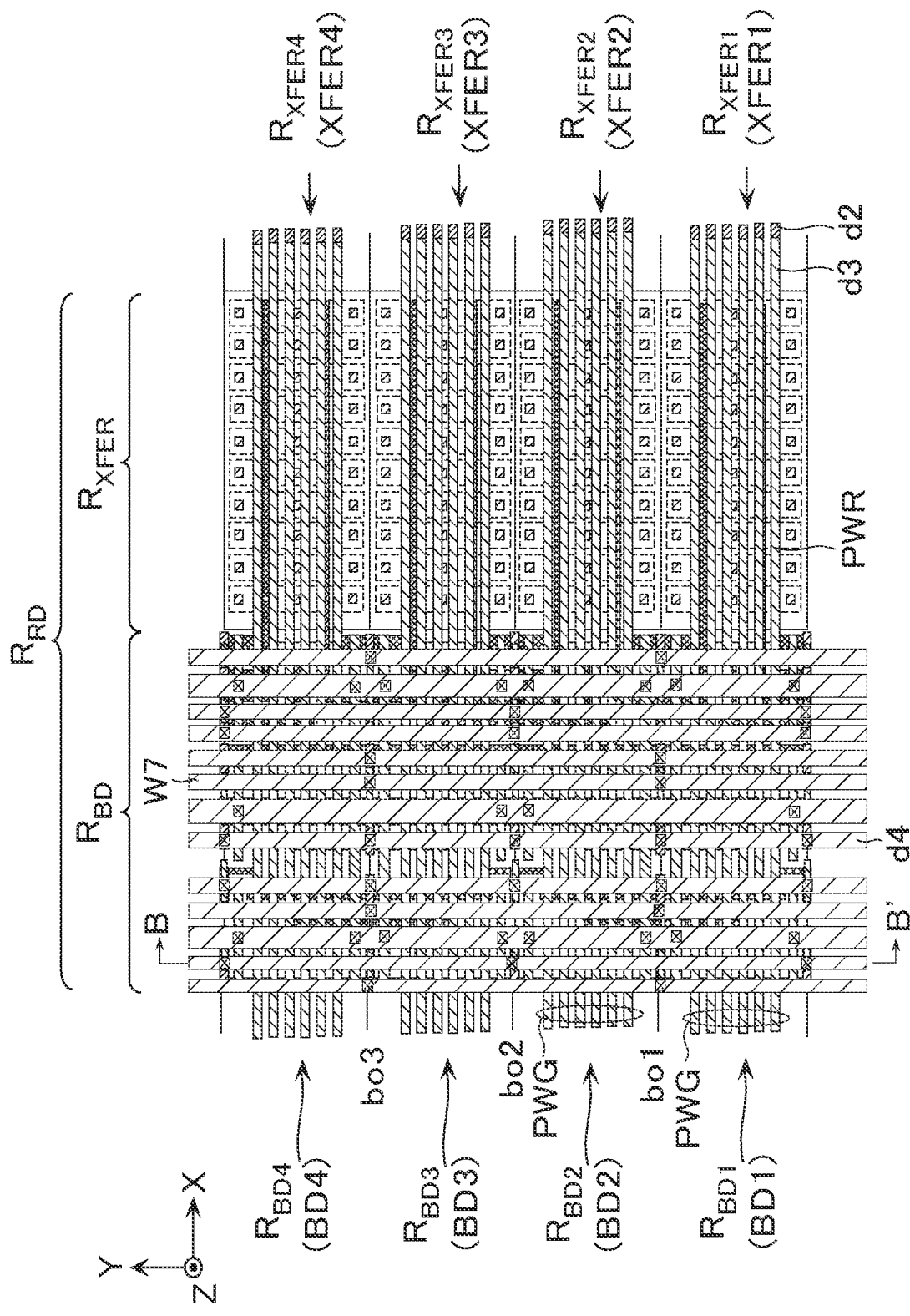
FIG. 12 is an enlarged schematic plan view illustrating a part of FIG. 8.
Figure 13:
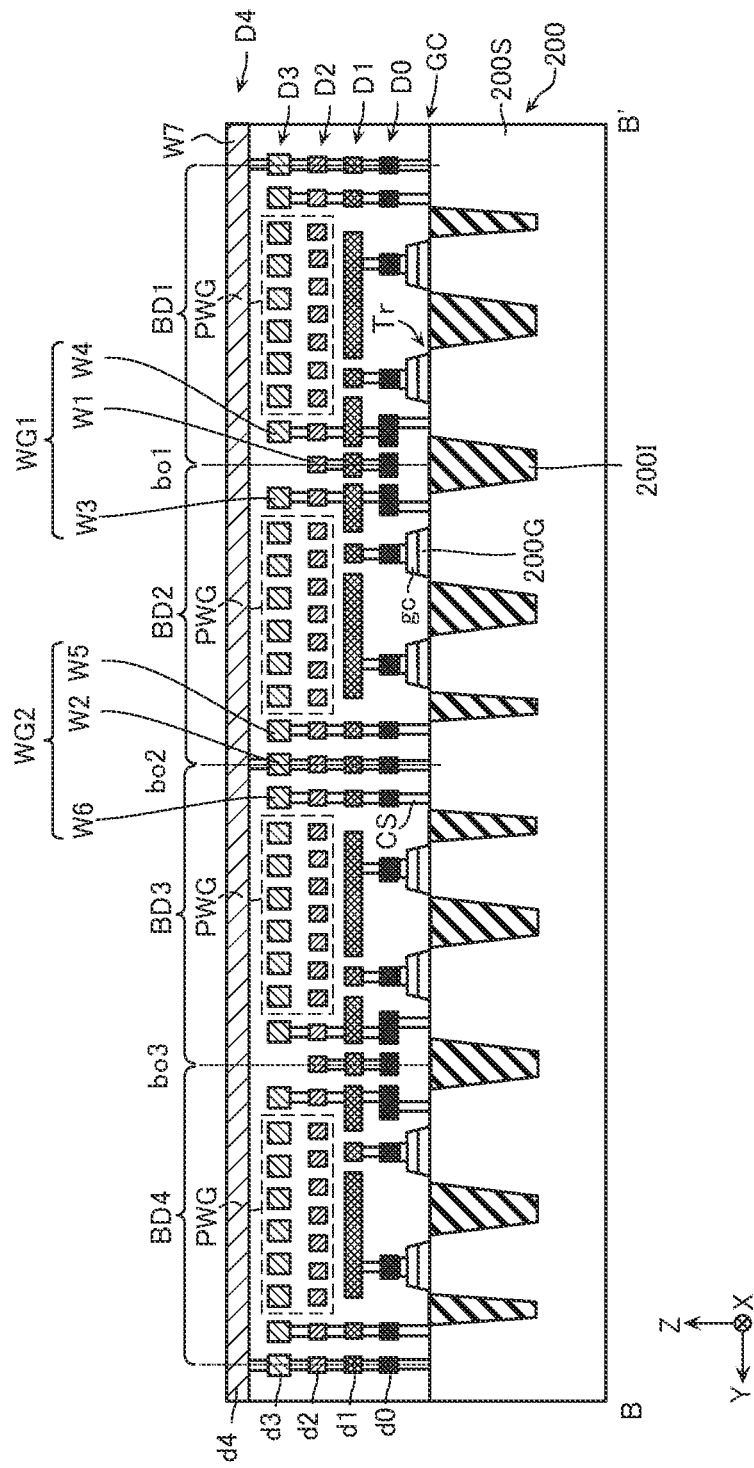
FIG. 13 is a cross-sectional view when

FIG. 9, FIG. 11, and FIG. 12 are schematic plan views of the further enlarged four row decoder regions $R_{RD}$ indicated by A in FIG. 8. FIG. 10 is an enlarged schematic plan view illustrating a part of FIG. 9. FIG. 13 is a cross-sectional view when the configuration in FIG. 12 is taken along line B-B' and viewed in an arrow direction. Note that, in FIG. 9 to FIG. 13, the same hatching indicates the same wiring layer.

As illustrated in FIG. 9, in the block decoder region $R_{BD}$, a first block decoder region $R_{BD1}$ in which a first block decoder BD1 is disposed, a second block decoder region $R_{BD2}$ in which a second block decoder BD2 is disposed, a third block decoder region $R_{BD3}$ in which a third block decoder BD3 is disposed, and a fourth block decoder region $R_{BD4}$ in which a fourth block decoder BD4 are disposed in this order in the Y-direction.

In the transfer gate group region $R_{XFER}$ adjacent to these block decoder regions $R_{BD1}$ to $R_{BD4}$ in the X-direction, a first transfer gate group region $R_{XFER1}$ in which the first transfer gate group XFER1 is disposed, a second transfer gate group region $R_{XFER2}$ in which a second transfer gate group XFER2 is disposed, a third transfer gate group region $R_{XFER3}$ in which a third transfer gate group XFER3 is disposed, and a fourth transfer gate group region $R_{XFER4}$ in which a fourth transfer gate group XFER4 is disposed are disposed in this order in the Y-direction. Each of the transfer gate groups XFER1 to XFER4 includes the plurality of transfer transistors TRX arranged in the X-direction and the Y-direction. To gates of these transfer transistors TRX, the block select lines BLKSEL extending from the block decoders BD1 to BD4 are electrically connected.

As viewed in the Z-direction, on a first boundary bo1 as a boundary between the first block decoder region $R_{BD1}$ and the second block decoder region $R_{BD2}$ adjacent in the Y-direction, a first boundary region $R_{B1}$ including the first boundary bo1 is disposed. As viewed in the Z-direction, on a second boundary bo2 as a boundary between the second block decoder region $R_{BD2}$ and the third block decoder region $R_{BD3}$ adjacent in the Y-direction, a second boundary region $R_{B2}$ including the second boundary bo2 is disposed. As viewed in the Z-direction, on a third boundary bo3 as a boundary between the third block decoder region $R_{BD3}$ and the fourth block decoder region $R_{BD4}$ adjacent in the Y-direction, a third boundary region $R_{B3}$ including the third boundary bo3 is disposed.

Wiring patterns P1, P3 of the wirings d0 to d4 constituting the first block decoder BD1 and the third block decoder BD3 and wiring patterns P2, P4 of the wirings d0 to d4 constituting the second block decoder BD2 and the fourth block decoder BD4 are substantially the same excluding a small difference, such as a via-wiring. The wiring pattern P1 and the wiring pattern P2 are mutually linearly symmetrical (a mirror pattern) with respect to the first boundary bo1. The wiring pattern P2 and the wiring pattern P3 are mutually linearly symmetrical (a mirror pattern) with respect to the second boundary bo2. The wiring pattern P3 and the wiring pattern P4 are mutually linearly symmetrical (a mirror pattern) with respect to the third boundary bo3.

Among the wirings d0 to d4 connected to the block decoders BD1 to BD4, the wirings d2, d3 disposed in the wiring layers D2, D3 are disposed in any of the first boundary region $R_{B1}$, the second boundary region $R_{B2}$, and the third boundary region $R_{B3}$.

FIG. 10 is a plan view of the enlarged second block decoder BD2 in FIG. 9. Note that the fourth block decoder BD4 in FIG. 9 also has the similar configuration. Additionally, the first block decoder BD1 and the third block decoder BD3 in FIG. 9 have a pattern of being inverted in the Y-direction with respect to the second block decoder BD2.

As illustrated in FIG. 10, a first wiring group WG1 is disposed in the wiring layer D2, D3 in the first boundary region $R_{B1}$. The first wiring group WG1 includes a wiring W11 disposed in the wiring layer D2 on the first boundary bo1 and a wiring W12 disposed in the wiring layer D3 on the first boundary bo1. Hereinafter, these wirings W11, W12 are collectively referred to as a wiring W1 in some cases. The wiring W1 is a wiring common to the adjacent first block decoder BD1 and second block decoder BD2. The first wiring group WG1 includes wirings W3, W4 disposed on both sides in the Y-direction of the wiring W1. The wirings W3, W4 are also wirings common to the adjacent first block decoder BD1 and second block decoder BD2. For example, the ground voltage VSS is applied to these wirings W3, W4. In view of this, the wirings W3, W4 also function as shield wirings of the wiring W1.

A second wiring group WG2 is disposed in the wiring layers D2, D3 in the second boundary region $R_{B2}$. The second wiring group WG2 includes a wiring W21 disposed in the wiring layer D2 on the second boundary bo2 and a wiring layer W22 disposed in the wiring layer D3 on the second boundary bo2. Hereinafter, these wirings W21, W22 are collectively referred to as a wiring W2 in some cases. The wiring W2 is a wiring common to the adjacent second block decoder BD2 and third block decoder BD3. The second wiring group WG2 includes wirings W51, W52, W53 disposed on one side in the Y-direction of the wiring W2 and wirings W61, W62, W63 disposed on the other side. Hereinafter, the wirings W51, W52, W53 are collectively referred to as a wiring W5 in some cases. Additionally, the wirings W61, W62, W63 are collectively referred to as a wiring W6 in some cases. The wirings W5, W6 are also wirings common to the adjacent second block decoder BD2 and third block decoder BD3. For example, the ground voltage VSS is applied to the wirings W51, W53, W61, W63. For example, a reading voltage VRD is applied to the wirings W51, W62. In view of this, the wirings W5, W6 also function as shield wirings of the wiring W2.

Between the first boundary region RB and the second boundary region $R_{B2}$, a passing wiring region $R_{PW}$ is disposed. In the passing wiring region $R_{PW}$, a passing wiring group PWG is disposed. The passing wiring group PWG includes a plurality of passing wirings PWR. In the embodiment, a width in the Y-direction of the passing wiring group PWG may be configured to be larger than a width in the Y-direction of the first wiring group WG1 and larger than a width in the Y-direction of the second wiring group WG2. Additionally, the number of passing wirings PWR disposed in the Y-direction and included in the passing wiring group PWG may be configured to be larger than the number of a plurality of wirings disposed in the Y-direction included in the first wiring group WG1 and larger than the number of a plurality of wirings disposed in the Y-direction included in the second wiring group WG2.

FIG. 11 is a plan view illustrating a configuration of adding the passing wirings PWR to the configuration in FIG. 9. The plurality of passing wirings PWR are disposed as the wirings d2, d3 in the wiring layers D2, D3. The plurality of passing wirings PWR are arranged in the Y-direction, extend in the X-direction, and pass through the block decoder region $R_{BD}$ and the transfer gate group region $R_{XFER}$ in the X-direction without being connected to the circuit elements in these regions $R_{BD}$ and $R_{XFER}$. The passing wiring PWR, for example, transfers an output voltage from the voltage generation circuit VG, various control signals of the second peripheral circuit PC2, and the like.

FIG. 12 is a plan view illustrating a configuration of adding wirings W7 on the block decoder region $R_{BD}$ to the configuration in FIG. 11.

As illustrated in FIG. 12 and FIG. 13, the wirings W7 are disposed as wirings d4 in the wiring layer D4, extend in the Y-direction, and are arranged in the X-direction. The wirings W7 are connected to a part of the wirings W1 to W6 and the like of the plurality of block decoders BD arranged in the Y-direction in common. The wiring W7, for example, transfers the power supply voltage VCC, the ground voltage VSS, the block address BA, and a control signal C1.

According to the embodiment, since the wiring patterns P1 to P4 of the block decoders BD1 to BD4 adjacent in the Y-direction are linearly symmetrical with respect to the respective boundaries bo1 to bo3, the wirings W1, W2 can be easily configured as the common wirings between the adjacent block decoders BD1 to BD4. Additionally, like the wirings W51, W53 and the wiring W52, and the wirings W61, W63 and the wiring W62, wirings at the different voltages (VSS, VRD) are disposed at the same position in the Y-direction. Consequently, the number of wirings in the Y-direction in the boundary regions $R_{B1}$ to $R_{B4}$ can be reduced. Thus, as illustrated in FIG. 10, a width wp in the Y-direction of the passing wiring region $R_{PW}$ between the first wiring group WG1 and the second wiring group WG2 can be widely ensured. Additionally, as illustrated in FIG. 13, the passing wiring group PWG is disposed in the two layers of the wiring layers D2, D3. Consequently, the number of passing wirings PWR can be increased, and layout design of the circuit can be facilitated.

According to the embodiment, since the wirings W1, W2 are the common wirings between the adjacent block decoders BD1 to BD4, parasitic capacitance can be lower than that in the case of different wirings.

Additionally, the wirings W1, W2 can eliminate an influence of noise by the shield effect of the wirings W3, W4 and the wirings W5, W6 disposed on both sides of the wirings W1, W2.

Second Embodiment

Figure 14:
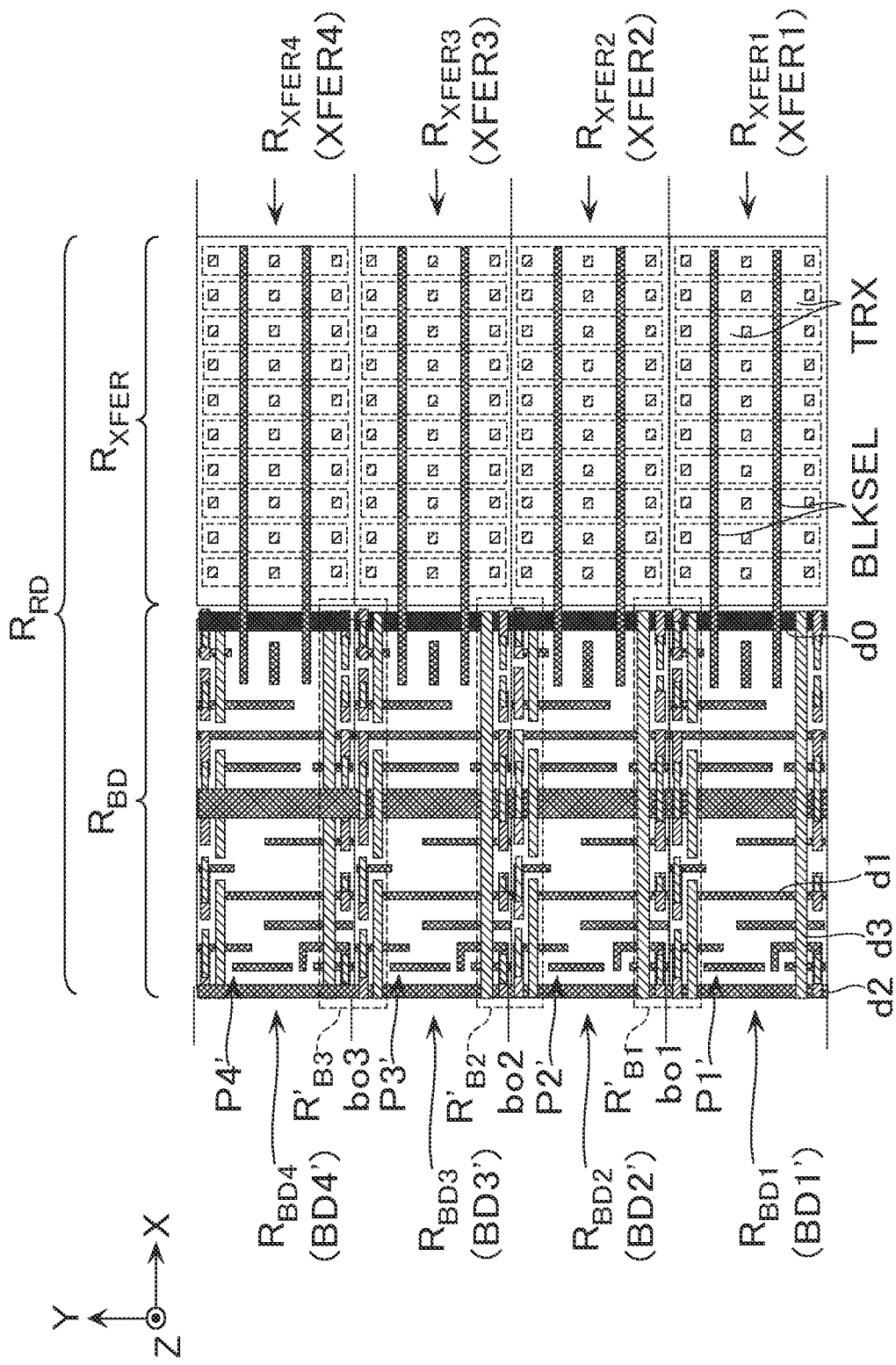
FIG. 14 is a schematic plan view illustrating a part of enlarged semiconductor memory device according to a second embodiment.
Figure 15:
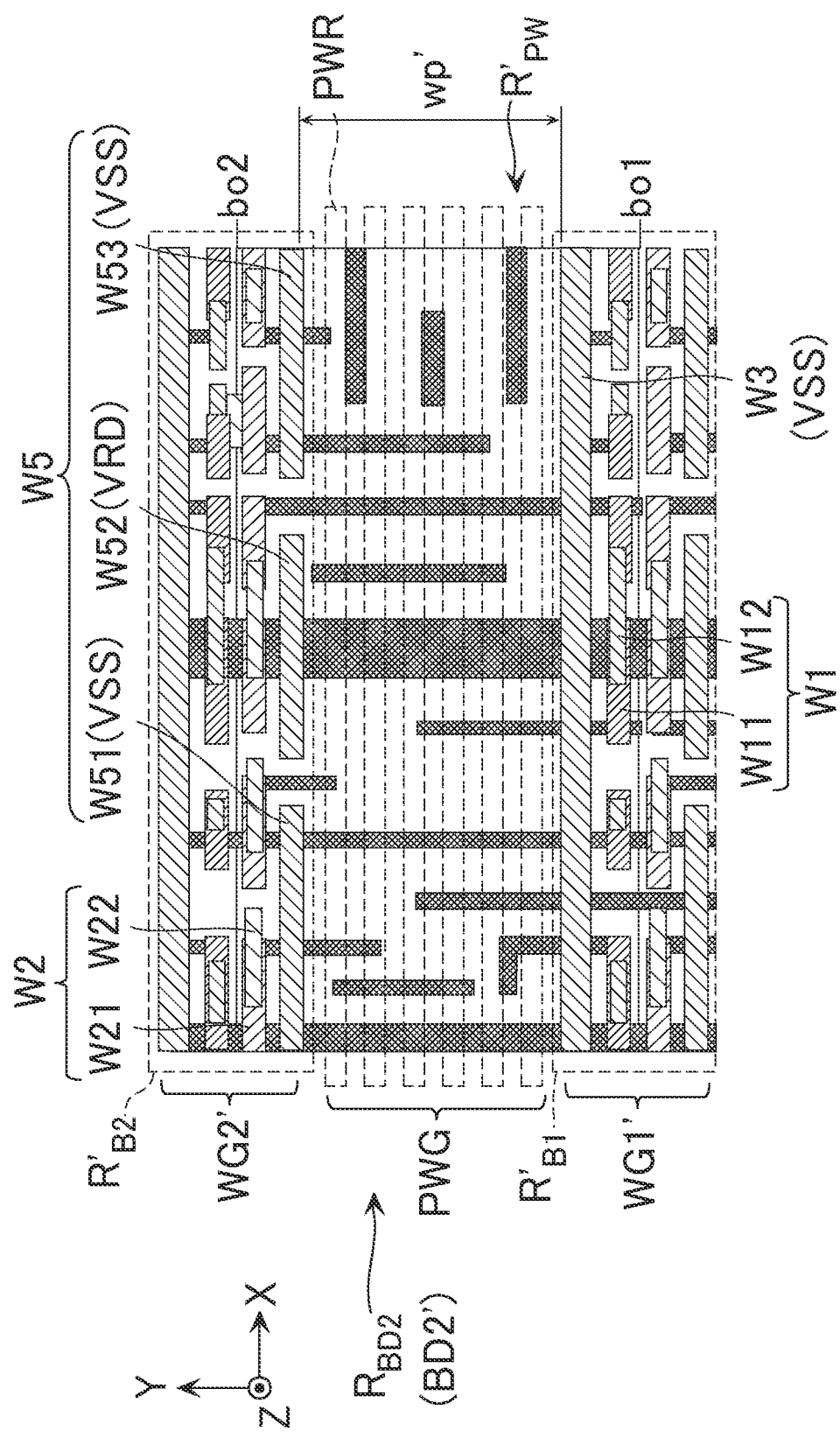
FIG. 15 is an enlarged schematic plan view illustrating a part of FIG. 14.

FIG. 14 is a schematic plan view illustrating a configuration of a part of a semiconductor memory device according to the second embodiment. FIG. 15 is a plan view of an enlarged second block decoder BD2' in FIG. 14. In the following description, same reference numerals are given to parts similar to those of the first embodiment to omit the description.

The semiconductor memory device according to the second embodiment is configured basically similar to the semiconductor memory device according to the first embodiment.

However, as illustrated in FIG. 14, in the second embodiment, wiring patterns P1', P2', P3 ', P4' of block decoders BD1', BD2 ', BD3', BD4' disposed in the Y-direction are all the same, and the wiring patterns of the adjacent block decoders BD are not linearly symmetrical patterns. In the embodiment, the wirings W1, W2, W3, W5 included in wiring groups WG1', WG2' of boundary regions R'$_{B1}$, R'$_{B2}$, R'$_{B3}$ are not common wirings between the adjacent block decoders BD1', BD3'. In view of this, since each of the wiring groups WG1', WG2' includes the four wirings W1, W2, W3, W5 as viewed in the Z-direction, compared with the first embodiment, a width wp' in the Y-direction of a wiring region R'$_{PW}$ of the passing wirings PWR becomes narrower than the width wp of the first embodiment. However, in the embodiment as well, by concentrating the wirings W1, W2, W3, W5 of the block decoders BD1', BD2', BD3 ', BD4' in the boundary regions R'$_{B1}$, R'$_{B2}$, R'$_{B3}$, the space for the passing wirings PWR can be ensured.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a semiconductor substrate;
a wiring layer disposed to be spaced from the semiconductor substrate in a first direction intersecting with the semiconductor substrate; and
a memory layer with the wiring layer interposed between the memory layer and the semiconductor substrate in the first direction, wherein
the semiconductor substrate includes:
a first circuit region that includes a first circuit;
a second circuit region that includes a second circuit; and
a third circuit region that includes a third circuit,
the first circuit region, the second circuit region and the third circuit region being disposed in a second direction intersecting with the first direction, wherein
the wiring layer includes:
a first boundary region that includes a first boundary as a boundary between the first circuit region and the second circuit region adjacent in the second direction as viewed in the first direction;
a second boundary region that includes a second boundary as a boundary between the second circuit region and the third circuit region adjacent in the second direction as viewed in the first direction; and
a passing wiring region between the first boundary region and the second boundary region, wherein
the first boundary region includes a first wiring group,
the second boundary region includes a second wiring group,
the passing wiring region includes a passing wiring group that passes through the second circuit region in a third direction intersecting with the first direction and the second direction as viewed in the first direction,
the first wiring group, the second wiring group, and the passing wiring group are disposed in a same layer where positions in the first direction of the first wiring group, the second wiring group, and the passing wiring group are same,
a wiring disposed in a same layer as the passing wiring group and electrically connected to the second circuit in the second circuit region is included in any one of the first wiring group and the second wiring group,
the first circuit has a first wiring pattern viewed in the first direction,
the second circuit has a second wiring pattern viewed in the first direction,
the third circuit has a third wiring pattern viewed in the first direction,
the first wiring pattern and the second wiring pattern are linearly symmetrical with respect to the first boundary,
the second wiring pattern and the third wiring pattern are linearly symmetrical with respect to the second boundary,
the first wiring group includes a plurality of first wirings disposed in the third direction at positions overlapping with the first boundary as viewed in the first direction,
the second wiring group includes a plurality of second wirings disposed in the third direction at positions overlapping with the second boundary as viewed in the first direction,
each of the plurality of first wirings is connected to the first circuit and the second circuit in common, and
each of the plurality of second wirings is connected to the second circuit and the third circuit in common.

2. The semiconductor memory device according to claim 1, wherein
the first wiring group includes a third wiring and a fourth wiring disposed on both sides in the second direction of the first wiring, and a fixed voltage is supplied to the third wiring and the fourth wiring,
the second wiring group includes a fifth wiring and a sixth wiring disposed on both sides in the second direction of the second wiring, and a fixed voltage is supplied to the fifth wiring and the sixth wiring, and
the passing wiring group is adjacent to the third wiring or the fourth wiring and adjacent to the fifth wiring or the sixth wiring.

3. The semiconductor memory device according to claim 2, wherein
at least parts of the third wiring, the fourth wiring, the fifth wiring, and the sixth wiring include a plurality of wirings arranged in the third direction.

4. The semiconductor memory device according to claim 1, further comprising a plurality of wiring layers disposed between the semiconductor substrate and the memory layer and in the first direction and including the wiring layer, wherein
the first wiring group, the second wiring group, and the passing wiring group are disposed in the respective plurality of wiring layers.

5. A semiconductor memory device comprising:
a semiconductor substrate;
a wiring layer disposed to be spaced from the semiconductor substrate in a first direction intersecting with the semiconductor substrate; and
a memory layer with the wiring layer interposed between the memory layer and the semiconductor substrate in the first direction, wherein
the semiconductor substrate includes:
a first circuit region that includes a first circuit;
a second circuit region that includes a second circuit; and a third circuit region that includes a third circuit, the first circuit region, the second circuit region and the third circuit region being disposed in a second direction intersecting with the first direction, wherein the wiring layer includes:

a first boundary region that includes a first boundary as a boundary between the first circuit region and the second circuit region adjacent in the second direction as viewed in the first direction;

a second boundary region that includes a second boundary as a boundary between the second circuit region and the third circuit region adjacent in the second direction as viewed in the first direction; and a passing wiring region between the first boundary region and the second boundary region, wherein the first boundary region includes a first wiring group, the second boundary region includes a second wiring group, the passing wiring region includes a passing wiring group that passes through the second circuit region in a third direction intersecting with the first direction and the second direction as viewed in the first direction, the first wiring group, the second wiring group, and the passing wiring group are disposed in a same layer where positions in the first direction of the first wiring group, the second wiring group, and the passing wiring group are same, a wiring disposed in a same layer as the passing wiring group and electrically connected to the second circuit in the second circuit region is included in any one of the first wiring group and the second wiring group, the memory layer includes a plurality of memory blocks, and the first circuit, the second circuit, and the third circuit are block decoders that select any of the plurality of memory blocks.

6. A semiconductor memory device comprising:

a semiconductor substrate;

a memory layer disposed to be spaced from the semiconductor substrate in a first direction intersecting with the semiconductor substrate; and a wiring layer disposed between the semiconductor substrate and the memory layer, wherein the semiconductor substrate includes:

a first circuit region that includes a first circuit;

a second circuit region that includes a second circuit; and a third circuit region that includes a third circuit, the first circuit region, the second circuit region and the third circuit region being disposed in a second direction intersecting with the first direction, wherein the wiring layer includes:

a first boundary region that includes a first boundary as a boundary between the first circuit region and the second circuit region adjacent in the second direction as viewed in the first direction;

a second boundary region that includes a second boundary as a boundary between the second circuit region and the third circuit region adjacent in the second direction as viewed in the first direction; and a passing wiring region between the first boundary region and the second boundary region, wherein the first boundary region includes a first wiring group, the second boundary region includes a second wiring group, the passing wiring region includes a passing wiring group that passes through the second circuit region in a third direction intersecting with the first direction and the second direction as viewed in the first direction, the first wiring group, the second wiring group, and the passing wiring group are disposed in a same layer where positions in the first direction of the first wiring group, the second wiring group, and the passing wiring group are same, the passing wiring group has a width in the second direction larger than a width in the second direction of the first wiring group and larger than a width in the second direction of the second wiring group, the first circuit has a first wiring pattern viewed in the first direction, the second circuit has a second wiring pattern viewed in the first direction, the third circuit has a third wiring pattern viewed in the first direction, the first wiring pattern and the second wiring pattern are linearly symmetrical with respect to the first boundary, the second wiring pattern and the third wiring pattern are linearly symmetrical with respect to the second boundary, the first wiring group includes a plurality of first wirings disposed in the third direction at positions overlapping with the first boundary as viewed in the first direction, the second wiring group includes a plurality of second wirings disposed in the third direction at positions overlapping with the second boundary as viewed in the first direction, each of the plurality of first wirings is connected to the first circuit and the second circuit in common, and each of the plurality of second wirings is connected to the second circuit and the third circuit in common.

7. The semiconductor memory device according to claim 6, wherein the first wiring group includes a third wiring and a fourth wiring disposed on both sides in the second direction of the first wiring, and a fixed voltage is supplied to the third wiring and the fourth wiring, the second wiring group includes a fifth wiring and a sixth wiring disposed on both sides in the second direction of the second wiring, and a fixed voltage is supplied to the fifth wiring and the sixth wiring, and the passing wiring group is adjacent to the third wiring or the fourth wiring and adjacent to the fifth wiring or the sixth wiring.

8. The semiconductor memory device according to claim 7, wherein at least parts of the third wiring, the fourth wiring, the fifth wiring, and the sixth wiring include a plurality of wirings arranged in the third direction.

9. The semiconductor memory device according to claim 6, further comprising a plurality of wiring layers disposed between the semiconductor substrate and the memory layer and in the first direction and including the wiring layer, wherein the first wiring group, the second wiring group, and the passing wiring group are disposed in the respective plurality of wiring layers.

10. A semiconductor memory device comprising:

a semiconductor substrate;

a memory layer disposed to be spaced from the semiconductor substrate in a first direction intersecting with the semiconductor substrate; and a wiring layer disposed between the semiconductor substrate and the memory layer, wherein
the semiconductor substrate includes:
a first circuit region that includes a first circuit;
a second circuit region that includes a second circuit; and
a third circuit region that includes a third circuit,
the first circuit region, the second circuit region and the third circuit region being disposed in a second direction intersecting with the first direction,
wherein
the wiring layer includes:
a first boundary region that includes a first boundary as a boundary between the first circuit region and the second circuit region adjacent in the second direction as viewed in the first direction;
a second boundary region that includes a second boundary as a boundary between the second circuit region and the third circuit region adjacent in the second direction as viewed in the first direction; and
a passing wiring region between the first boundary region and the second boundary region, wherein
the first boundary region includes a first wiring group,
the second boundary region includes a second wiring group,
the passing wiring region includes a passing wiring group that passes through the second circuit region in a third direction intersecting with the first direction and the second direction as viewed in the first direction,
the first wiring group, the second wiring group, and the passing wiring group are disposed in a same layer where positions in the first direction of the first wiring group, the second wiring group, and the passing wiring group are same,
the passing wiring group has a width in the second direction larger than a width in the second direction of the first wiring group and larger than a width in the second direction of the second wiring group,
the memory layer includes a plurality of memory blocks, and
the first circuit, the second circuit, and the third circuit are block decoders that select any of the plurality of memory blocks.

11. A semiconductor memory device comprising:
a semiconductor substrate;
a memory layer disposed to be spaced from the semiconductor substrate in a first direction intersecting with the semiconductor substrate; and
a wiring layer disposed between the semiconductor substrate and the memory layer, wherein
the semiconductor substrate includes:
a first circuit region that includes a first circuit;
a second circuit region that includes a second circuit; and
a third circuit region that includes a third circuit,
the first circuit region, the second circuit region and the third circuit region being disposed in a second direction intersecting with the first direction,
wherein
the wiring layer includes:
a first boundary region that includes a first boundary as a boundary between the first circuit region and the second circuit region adjacent in the second direction as viewed in the first direction;
a second boundary region that includes a second boundary as a boundary between the second circuit region and the third circuit region adjacent in the second direction as viewed in the first direction; and
a passing wiring region between the first boundary region and the second boundary region, wherein
the first boundary region includes a first wiring group,
the second boundary region includes a second wiring group,
the passing wiring region includes a passing wiring group that passes through the second circuit region in a third direction intersecting with the first direction and the second direction as viewed in the first direction,
the first wiring group, the second wiring group, and the passing wiring group are disposed in a same layer where positions in the first direction of the first wiring group, the second wiring group, and the passing wiring group are same,
a number of a plurality of wirings disposed in the second direction included in the passing wiring group is larger than a number of a plurality of wirings disposed in the second direction included in the first wiring group and is larger than a number of a plurality of wirings disposed in the second direction included in the second wiring group,
the first circuit has a first wiring pattern viewed in the first direction,
the second circuit has a second wiring pattern viewed in the first direction,
the third circuit has a third wiring pattern viewed in the first direction,
the first wiring pattern and the second wiring pattern are linearly symmetrical with respect to the first boundary,
the second wiring pattern and the third wiring pattern are linearly symmetrical with respect to the second boundary,
the first wiring group includes a plurality of first wirings disposed in the third direction at positions overlapping with the first boundary as viewed in the first direction,
the second wiring group includes a plurality of second wirings disposed in the third direction at positions overlapping with the second boundary as viewed in the first direction,
each of the plurality of first wirings is connected to the first circuit and the second circuit in common, and
each of the plurality of second wirings is connected to the second circuit and the third circuit in common.

12. The semiconductor memory device according to claim 11, wherein
the first wiring group includes a third wiring and a fourth wiring disposed on both sides in the second direction of the first wiring, and a fixed voltage is supplied to the third wiring and the fourth wiring,
the second wiring group includes a fifth wiring and a sixth wiring disposed on both sides in the second direction of the second wiring, and a fixed voltage is supplied to the fifth wiring and the sixth wiring, and
the passing wiring group is adjacent to the third wiring or the fourth wiring and adjacent to the fifth wiring or the sixth wiring.

13. The semiconductor memory device according to claim 12, wherein
at least parts of the third wiring, the fourth wiring, the fifth wiring, and the sixth wiring include a plurality of wirings arranged in the third direction.

14. The semiconductor memory device according to claim 11, further comprising a plurality of wiring layers disposed between the semiconductor substrate and the memory layer and in the first direction and including the wiring layer, wherein
the first wiring group, the second wiring group, and the passing wiring group are disposed in the respective plurality of wiring layers.

* * * * *